United States Patent [19]

Saito et al.

[11] Patent Number: 5,589,705
[45] Date of Patent: Dec. 31, 1996

[54] REAL-TIME SEMICONDUCTOR RADIATION DETECTOR

[75] Inventors: Yutaka Saito; Yoshikazu Kojima, both of Tokyo, Japan

[73] Assignee: Seiko Instruments Inc., Japan

[21] Appl. No.: 417,141

[22] Filed: Mar. 17, 1995

Related U.S. Application Data

[63] Continuation of Ser. No. 36,058, Mar. 23, 1993, abandoned.

[30] Foreign Application Priority Data

| Mar. 24, 1992 | [JP] | Japan | 4-066364 |
| Mar. 5, 1993 | [JP] | Japan | 5-045439 |

[51] Int. Cl.$^6$ .................................................. H01L 31/00
[52] U.S. Cl. ........................ 257/459; 257/461; 257/448; 257/443
[58] Field of Search ................................. 257/448, 443, 257/459, 461, 447, 232, 233, 462

[56] References Cited

U.S. PATENT DOCUMENTS

| 4,377,817 | 3/1983 | Nishizawa et al. | 257/447 |
| 4,779,004 | 10/1988 | Tew et al. | 250/578 |
| 4,896,201 | 1/1990 | Kemmer et al. | 257/443 |
| 4,916,512 | 4/1990 | Ohmi et al. | 257/443 |
| 5,104,819 | 4/1992 | Freiberger et al. | 437/43 |
| 5,241,169 | 8/1993 | Ohzu | 257/443 |

FOREIGN PATENT DOCUMENTS

| 0086628 | 8/1983 | European Pat. Off. |  |
| 0295365 | 12/1988 | European Pat. Off. |  |
| 2367353 | 5/1978 | France. |  |
| 60-213057 | 10/1985 | Japan | 257/232 |
| 60-217662 | 10/1985 | Japan | 257/448 |
| 61-47663 | 3/1986 | Japan | 257/232 |
| 63-131570 | 6/1988 | Japan | 257/462 |

OTHER PUBLICATIONS

Tanaka et al., "A Low–Noise Bi–CMOS Linear Image Sensor with Auto–Focusing Function", IEEE Transactions on Electron Devices, vol. 36, No. 1, Jan. 1989, pp. 39–45.
Patent Abstracts of Japan, vol. 15, No. 470 (E–1139), 28 Nov. 1991.
Patent Abstracts of Japan, vol. 12, No. 389 (E–669), 17 Oct. 1988.
Optoelectronics, vol. 6, No. 2, pp. 245–260 Dec. 1991, Tokyo, Japan, J. Hynecek, "BCMD–A New Photosite Concept For Advanced Image Sensors".

*Primary Examiner*—Mahshid Saadat
*Assistant Examiner*—Courtney A. Bowers
*Attorney, Agent, or Firm*—Adams & Wilks

[57] ABSTRACT

Semiconductor radial rays detector is provided that improves a breakdown voltage yield of a gate insulating film of a semiconductor radial rays detector and prevents an increase in resistance of a gate electrode caused by the improvement in the breakdown voltage yield. In the inventive semiconductor radial rays detector, material used as a gate electrode 1 of a reading condenser is not an Al film (aluminum film) but a POLY Si film (a polycrystalline silicon film), or silicide or metal including silicide with a high melting point such as WSi (tungsten silicide) (strictly its composition is indefinite as expressed as $W_xSi_y$) or TiSi (titan silicide) (expressed as $Ti_xSi$, in the same manner). Further, a contact hole 2 is provided on the gate electrode 1 through an inter-insulating film 4 as the inter-insulating film for wiring, and an Al electrode 3 coupled to an output terminal is provided over the contact hole.

11 Claims, 24 Drawing Sheets

F I G. 3 6
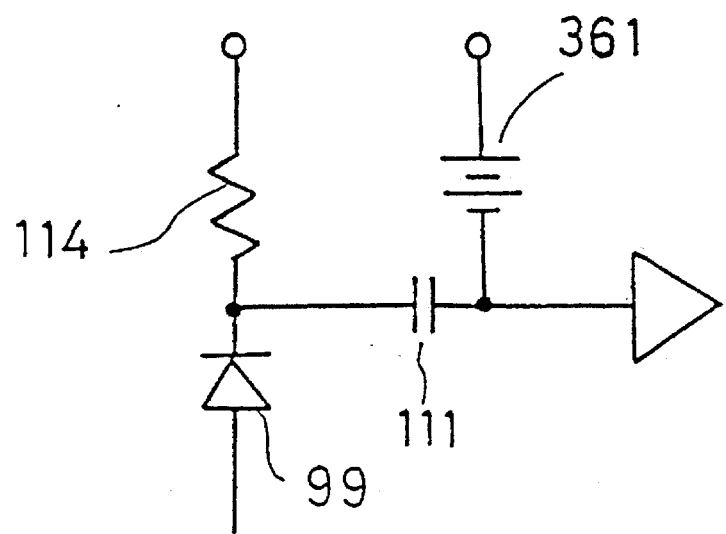

REAL-TIME SEMICONDUCTOR RADIATION DETECTOR

This is a continuation of parent application Ser. No. 08/036,058 filed Mar. 23, 1993, now abandoned.

BACKGROUND OF THE INVENTION

The present invention relates generally to a semiconductor detector, and more specifically to devices used for measuring visible light, infrared rays and ultraviolet rays, x-rays, radial rays and other charged particles.

DESCRIPTION OF THE PRIOR ART

When used in the present specification, the term detector or semiconductor detector includes semiconductor devices and semiconductor integrated circuits which are commonly known as radial ray detectors, photodiodes, electromagnetic wave detectors, a photodiode array, a photosensor, a microstrip sensor, a double-sided microstrip sensor, a radiation sensor, a semiconductor photosensor, a semiconductor image sensor, a semiconductor image device and so on. In this specification, the term detecting refers to the characteristic that the sensor receives light and other radiation and converts it into electrical output signals. The phrase "a portion to be detected" refers to a light-receiving region of a photosensor, and further a device for producing signals in accordance with arranged light-receiving regions, such as a two dimensional data (image), is referred to herein as an image sensor.

A known device technology in the above-mentioned field is shown in a sectional view in FIG. 8, in which a $P^+$ type impurity region 82 referred to herein as a second conductivity type is provided on one surface of an N type semiconductor substrate 81 as a semiconductor substrate of a second conductivity type. As shown in FIG. 8, assuming that the surface on which the $P^+$ type impurity region 82 is referred to as a right side, an $N^+$ impurity region 83 having higher impurity density than that of the substrate 81 is provided on a reverse or left side of the substrate 81. The above three elements ($P^+$, $N^-$, and $N^+$) compose a PN type junction as a means for generating a carrier. The PN type junction having a depletion layer functions as a light receiving region or a light sensing means, namely a photosensor. The carrier is generated in the depletion layer by radial rays or other electromagnetic waves such as light. Each of the photosensors is coupled, through a gate insulating film 84, to a condenser, or capacitor having an electrode. That is to say a gate electrode 85 composed of Aluminum (hereinafter referred to as "Al"). The gate insulating film 84 includes an insulating film composed of $SiO_2$, and a condenser or capacitor is formed between the $P^+$ impurity region 82 and the gate electrode by the gate insulating film 84.

The condenser is provided in order to differentially process a change in the potential of a junction electrode which occurs in accordance with generated carriers and to output responsive signals to an output terminal. In other words, the condenser differentiates the change in potential and outputs the result. The output signals from gate electrode 85 are signal-processed and charged particles are counted in the conventional semiconductor image sensor. Such an image sensor can detect a change in intensity of incident light per unit-hour, and is especially suitable for use as a radiation detector in which the number of incident particles is small.

FIG. 11 is a block diagram showing a simplified circuit of a conventional semiconductor image sensor. Each photosensor is connected to an output terminal 113 through a condenser for reading CG 111 the value of which is determined by the $P^+$ and the $N^+$ impurity regions, and the gate electrode. Electrical signals can be detected from the output terminal. For instance, the output terminal of the photosensor is usually coupled to an external amplifier 112. The $P^+$ and the $N^+$ impurity regions of a photodiode are led through each of voltage bias resistances RB and bias line 114 to an anode 116 and a cathode 115, respectively. The voltage bias from a power source is applied to a photodiode for forming a depletion layer 86 shown in FIG. 8 and the height of the voltage bias depends on the characteristics of signals to be detected such as wavelength and energy, as well as the resistivity of the N type semiconductor substrate. The magnitude of voltage bias resistance RB 114 also depends on signals to be read out and the capacitance of the condenser 111, and is preferably as high as possible for detecting very weak signals such as charged particles.

FIG. 9 is a simplified plan view of the conventional semiconductor image sensor. The conventional device comprises a plurality of the $P^+$ impurity regions 82 and the $N^+$ impurity regions 83, each of which is a long, narrow strip of line structure (hereinafter referred to as a "strip"), which are arranged so as to intersect each other, for example, at right angles (any angles are applicable, not being limited to right angles.) The $P^+$ strips are coupled to the common anode through the respective voltage bias resistances RB 114. The $N^+$ strips are coupled to the common cathode through the respective voltage bias resistances RB 114. The number of the output terminals (pads) is equivalent to the number of the strips. With such a structure, the conventional semiconductor image sensor can capture the incident radiation and charged particles and can convert such information into two dimensional data.

FIG. 10 is a simplified plan view showing one of the $P^+$ strips which is composed of the $P^+$ impurity region 82 and the gate electrode 85. Since the $P^+$ and the $N^+$ strips are based on the same technical concepts in the present invention, the $P^+$ strip will be used to explain the present invention hereinafter. The present invention is also applied to the $N^+$ strips. Though the semiconductor substrate is explained with reference to an N type substrate, a P type semiconductor substrate is also based on almost identical concepts.

The conventional semiconductor image sensor has the above-mentioned sectional structure and planar structure, and also suffers from the following problems.

The first problem with the conventional device geometry is the low yield of the gate insulating film 84 deposited over the $P^+$ region and forming the reading condenser. In other words, it is necessary for the gate insulating film 84 forming the condenser CG 111 to have a sufficient breakdown voltage and it is also essential that the film 84 remain detect free over as large an area of the gate insulating film 84 as possible. However, many defects exist on the gate insulating film in the conventional structure and, as a result, the yield is considerably low. Another problem with these devices is that while this type of semiconductor image sensor generally requires a large surface area, in some cases it is impossible to form a semiconductor image sensor having a large area due to the incidence of defects.

The second problem is the low ratio of the capacitance (hereinafter referred to as capacity) of a junction condenser CJ 87 to the readout condenser CG 111 in a $P^+$ $N^-$ type junction which is composed of the $P^+$ type impurity region 82 and the N type semiconductor substrate 81 (the ratio is hereinafter referred to as a "a capacity ratio") Though this ratio of CG/CJ is preferably as large as possible (CG>CJ) from the viewpoint of improving device sensitivity and reaction rate, the maximum value of the ratio is limited to a certain level because a silicon dioxide film is used as the gate insulating film 84. It is obvious, however, that if an area of the $P^+$ type impurity region 82 is enlarged for increasing the capacitance CG, the junction capacitance CJ naturally increases accordingly. Moreover, if the gate insulating film 84 is made thinner for increasing only the capacity of CG, the breakdown voltage of the gate insulating film declines and it becomes impossible to apply a voltage bias high enough to read out the signals to the gate insulating film.

The third problem is that the inventive image sensor is a double-sided device in which a group of $P^+$ strips and a group of the $N^+$ strips are arranged perpendicular to each other on opposite sides of a substrate in order to obtain two dimensional data. Thus, manufacturing process of the sensor is very complicated, which also adds to the problem of a low yield.

The fourth problem with the conventional device geometry is that a spot defect on one strip causes a so-called line defect because a unit element of the photosensor is a strip and unites a function of wiring. For instance, if there is a spot defect in a strip of an X-coordinate or a Y-coordinate, the entire X-coordinate or the entire Y-coordinate of the strip including the spot defect becomes defective.

The fifth problem with the conventional geometry is that since a signal gain of the PN type junction used for the photosensor is small, the signal-to-noise, or SN ratio cannot be large.

SUMMARY OF THE INVENTION

It is therefore an object of the present invention to provide a semiconductor radiation detector (a radial ray detector, electromagnetic wave detector and the like) having a reading (or output) condenser of high quality.

It is another object of the present invention to provide a semiconductor radiation detector having a simple structure and which can be manufactured by a simple process.

It is still another object of the present invention to provide a semiconductor radiation detector having characteristics of high sensitivity.

It is yet another object of the present invention to provide a semiconductor radiation detector having characteristics of high speed, real-time response.

It is yet another object of the present invention to provide a semiconductor radiation detector having characteristics of high signal-to-noise ratio.

To achieve the above objects and others which will become apparent, in the present invention the following means are used.

The first means is to use, for a top electrode of the reading, or output condenser 85, not Al, but POLY Si (polycrystalline silicon film), or silicide, or a metal silicide with a high melting point such as WSi, tungsten silicide (though this material is represented as WSi, in the strict sense the composition is indefinite and is expressed by the formula $W_xSi_y$) and TiSi, titanium silicide (in the strict sense, $Ti_x Si_y$, in the same manner). In an illustrative embodiment, the POLY Si is used for a POLY Si gate electrode 1 shown in FIG. 1. In this context, another effective structure is that a contact hole 2 serving as a connection, or via hole is provided above the gate electrode 1 and an Al electrode 3 having an output terminal 113 (FIG. 2) is also provided over the contact hole in addition to the gate electrode 1.

The second means is to form the condenser insulating film of a CVD film. A CVD film is formed by chemical vapor deposition rather than by chemical oxidation. The insulating film of the condenser is not of a single-layer $SiO_2$ film but, as shown in the exemplary device of FIG. 3, is instead of a multilayer structure such as a three-layer structure including a $SiO_2$ film 31 (a top layer), a SiN film 32 (silicon nitride film, $Si_xN_y$) (a middle layer) and a $SiO_2$ film 33 (bottom layer), (hereinafter referred to as "an ONO structure" for simplification.) Furthermore, the $SiO_2$ film, the top layer, is made to be as thin as 10 nm, and the thickness of the middle layer and the bottom layer are determined depending upon the desired electric field strength and capacitance.

The third means is, as shown by the preferred embodiment in FIG. 4, to form a condenser electrode of at least a two-layer structure composed of at least a first condenser electrode 41 and a second condenser electrode 42. As shown in FIG. 7, the second condenser electrode 42 preferably has a contact hole 72 and is preferably coupled to a $P^+$ type impurity region 82 through an Al electrode 71. Namely, a first output, or reading condenser comprises, for example, the $P^+$ type impurity region 82 serving as the bottom electrode, the electrode 41 serving as the top electrode and the first insulating film 43 therebetween. A second output, or reading condenser may comprise the electrode 41 as the bottom electrode, the electrode 42 as the top electrode and the second insulating film 44 therebetween. The first electrode 41 which is the bottom electrode of the second condenser has a contact hole 73 and is connected to an Al electrode 3 having an output terminal 113. It is also possible for the first gate insulating film 43 and the second gate insulating film 44 to have the above-mentioned ONO or similar multilevel insulating structure in this device. It is also possible that, as shown in FIG. 6, a $SiO_2$ film 61 of the second gate insulating film 44 is as thick as a $SiO_2$ film 31 of the first gate insulating film 43, a SiN film 62 is as thick as a SiN film 32, and a $SiO_2$ film 63 is as thick as $SiO_2$ film 33. Further, it is also possible to make a condenser element with only the second reading condenser type, not using the first reading condenser type which comprises an insulating film formed on the $P^+$ type impurity region 82.

The fourth means is, as shown in preferred form in FIGS. 11 and 12, to avoid the conventional strip-shaped photosensors described above, but to use instead a matrix of small discrete photosensors (hereinafter referred to as "pixels") which are selectively spaced from one another and electrically connected to one another, with the pixels for each of two dimensions arranged on the same semiconductor surface.

The fifth means is, as shown in the exemplary circuit diagram of FIG. 18, to provide a voltage bias resistor RB 114 at each pixel.

The sixth means is to use an active sensor such as a bipolar transistor or avalanche photodiode as a sensing means instead of a PN type junction. An active sensor provides the ancillary benefit of carrier multiplication. An exemplary transistor is composed of a POLY Si emitter and has a readout, or output condenser CG 111 on a POLY Si emitter electrode 211.

Using the means mentioned above results in the following benefits:

The following benefits are obtained by using the first means. In the conventional device, a technique such as sputtering is used to form an Al film and in many cases diluted HF solution or the like is used for a preliminary surface treatment, which increases the defects in the base $SiO_2$. The $SiO_2$ is contaminated to a considerable degree during the step of sputtering, which sometimes causes a decline in a breakdown voltage yield of the gate insulating film 84. Such deterioration and contamination can be largely avoided by using POLY Si, WSi and the like because of the differences in conditions at the time of forming these films. Further, it is possible to fabricate a two-dimensional radiation detector having a two-dimensional arrangement of pixels. Each pixel has a reading, or output condenser with a Poly-Si film electrode. Respective Poly-Si film electrodes are connected to one another by wiring formed of a metal film deposited thereupon.

Using the second means leads to the function that the readout capacity ratio (CG/CJ) can be a much larger value than it is in the device of conventional geometry.

Using the third means described above, the readout capacity ratio can be selectively increased depending on the application.

The following benefits are obtained by using the fourth means.

1) the complexity of the manufacturing process of the conventional double-sided device geometry is avoided,
2) as a result of benefit 1), the yield of the semiconductor image sensor is substantially improved, and
3) it is possible to abrade or etch one side of the semiconductor image sensor in the last step of the manufacturing process and the semiconductor substrate can be made to be just thick enough for detection purposes.

Using the fifth means results in the benefit that if there is a defective pixel, only the individual defective pixel is inoperative and other pixels in the same line of the defective pixel are not affected by the defective pixel. In other words, no line defect occurs as in the conventional device geometry.

The use of the sixth means provides the benefit that the gain of each radiation sensing element is improved and the SN ratio is also improved.

BRIEF DESCRIPTION OF THE DRAWINGS

FIG. 36 is a simplified schematic diagram showing a circuit for forming a partial inversion region in accordance with the twelfth embodiment of the inventive semiconductor image sensor.

DETAILED DESCRIPTION OF THE PREFERRED EMBODIMENTS

Figure 1:
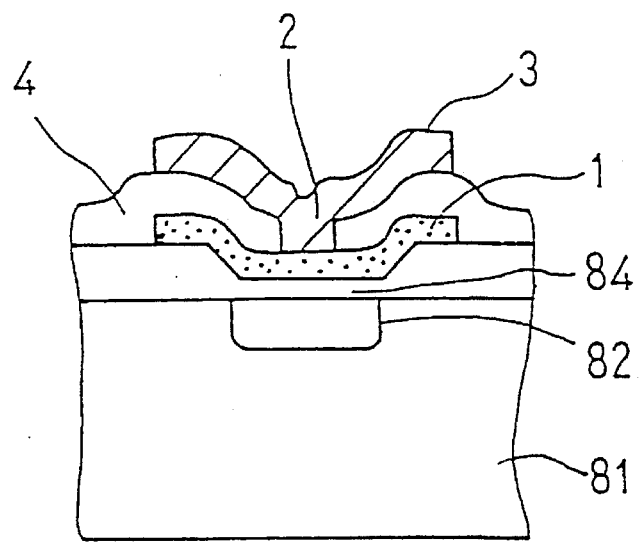
FIG. 1 is a simplified cross section showing the first embodiment of the inventive semiconductor image sensor.

Referring to the drawings, preferred embodiments of the present invention will be described in further detail.

FIG. 1 is a simplified cross section showing the first embodiment of the inventive semiconductor image sensor. A reading, or output condenser comprises a $P^+$ type impurity region 82 as a bottom electrode, an insulating film 84 deposited on the impurity region 82 serving as a dielectric and a gate electrode 1 serving as a top electrode. The photosensor is a PN junction diode comprising an N type semiconductor substrate 81 and a $P^+$ type impurity region 82 in the substrate. A POLY Si gate electrode 1 is formed on the gate insulating film 84 by CVD, for example, instead of the conventional gate electrode formed of Al. One of the significant benefits of using the POLY Si gate electrode is that conditions for the formation of POLY Si are largely different and more beneficial than those of Al. In other words, Al is usually formed by means of sputtering, vacuum deposition, and the like, along with chemical treatment with a diluted HF solution (hydrofluoric acid) necessary for surface pretreatment. This treatment causes etching of a certain amount (a decrease in the film thickness) of the gate insulating film which is a primary factor in the deteriorating quality of the gate insulating film. As a result, the defect ratio of the conventional device is increased. Further, a considerable amount of contamination such as that arising from the presence of alkali ions exists during the sputtering process. In this way, the breakdown voltage of the gate insulating film is actually decreased when the gate electrode is formed entirely of Al. On the other hand, POLY Si is usually formed by Low Pressure CVD (Chemical Vapor Deposition). One of the advantages of CVD film deposition is that the gate insulating film is not deteriorated in the pretreatment or deposition step. The other advantage is that the atmosphere during the deposition process is low pressure and high temperature, that is, it is overwhelmingly clean so that there is very little contamination. Therefore, the gate insulating film formed in this way is a $SiO_2$ film which is excellent both in quality and yield. There is a drawback, however, while the specific resistance of the Al is a sheet resistivity of approximately 30 m $\Omega/\square$ when a thickness of the Al is around 1 μm, the specific resistance of the POLY Si is many $\Omega/\square$ in sheet resistivity when the POLY Si is merely a few hundred nm in thickness. This high sheet resistivity sometimes causes difficulty in an electric circuit when a signal is read out. Therefore, an Al film 2 of low resistivity is formed on the electrode 1 to improve the problems due to the high resistivity of the POLY Si. Further, the sheet resistivity can be lowered to under a few $\Omega/\square$ by using a metal silicide film composed of a metal with a high melting point such as WSi, TiSi and so on. In this case the quality of the gate insulating film obtained is as satisfactory as that of the gate insulating film with the gate electrode composed of POLY Si.

Figure 2:
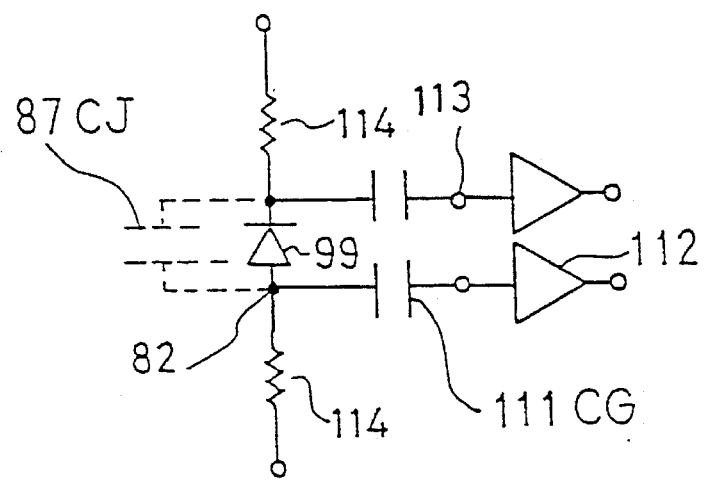
FIG. 2 is a simplified circuit schematic diagram explaining the second embodiment of the inventive semiconductor image sensor.

FIG. 2 is an electrical equivalent circuit of the inventive semiconductor image sensor. At least one electron-hole pair is generated within a depletion layer of a PN type diode 99 by incident light. As shown in FIG. 2, a condenser CG 111 composes a differentiating circuit. Consequently, when the potential across the diode changes due to generation of the carriers, an output according to change in the incident light is detected at the aluminum electrode 3, and the change is read out, for example, by a sense amplifier. The image sensor is particularly suitable for use as a radiation detector which detects the number of incident particles by counting them one by one.

However, a resistance as low as that of Al cannot be obtained yet. In this case, the resistance can be lowered by, as shown in FIG. 1, providing a contact, or via hole 2 on the gate electrode 1 through an interlayer insulating film 4 as an interlayer insulating film for wiring and providing an Al electrode 3 coupled to an output terminal 113 over the contact hole 2. The contact hole can be provided on only a part of a strip image sensor, but the resistance can be lowered more effectively if the contact hole is provided along the entire length of the strip and formed as widely as possible.

Figure 3:
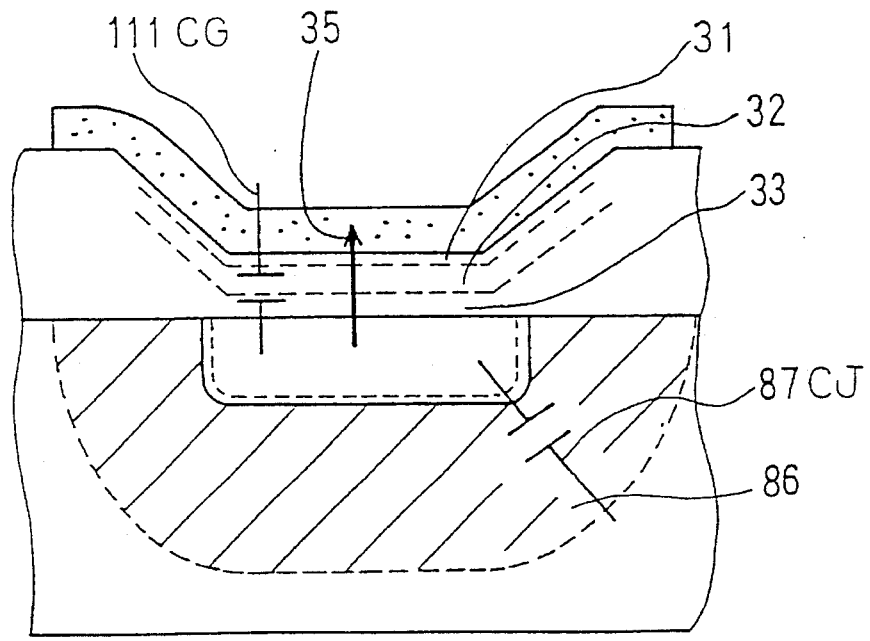
FIG. 3 is a simplified cross section showing the structure of a gate insulating film disclosed in the second embodiment of the inventive semiconductor image sensor.

FIG. 3 is a simplified cross section showing the structure of a gate insulating film in accordance with the second embodiment of the inventive semiconductor device. The insulating film of a reading condenser 111 is of a multilayer structure formed of different types of insulator materials. The gate insulating film is not of the conventional a one-layer structure of a $SiO_2$ film but, as shown in FIG. 3, is of a three-layer (ONO) structure composed of a $SiO_2$ film 31 (as a top layer), a SiN film 32 (a silicon nitride film, $Si_xN_y$) (as a middle layer) and a $SiO_2$ film 33 (as a bottom layer). The SiN film is most preferably deposited by a CVD procedure. If a voltage bias to be applied is 100 V, a thickness of the gate insulating film must generally be at least 250 nm even if a maximum operating electric field is 4 MV/cm (preferably under 3 MV) per unit film thickness. When the gate insulating film has a one-layer structure of a $SiO_2$ film, a readout capacitance CG 111 is 14E-9 $F/cm^2$ and a junction capacitance CJ 87 for an N-type semiconductor substrate 81 of a $P^+$ type impurity region 82 is 3E-9$F/cm^2$. Therefore, a ratio of CJ/CG becomes 20%, a rather unfavorable value. As known from FIG. 2, since the condenser CG 111 forms a differentiating circuit of a signal for a readout amplifier 112, making a capacity ratio of the capacitor CJ 87 to the capacitor CG 111 as great as possible leads to an increase in response ratio; and it is necessary that the capacitor CJ is at most 20% of the capacitor CG at the worst.

Therefore, if in the ONO structure mentioned above the thicknesses of the respective layers are 10 nm, 120 nm, and 120 nm sequentially from the top layer to the bottom layer, the ratio of the capacitance CJ to the capacity CG is improved by 16% as the relative dielectric constant of the SiN film is approximately twice as large as that of the $SiO_2$ film, that is, 18E-9 F/cm². Needless to say, if the ratio of the SiN film is increased to such as 10 nm, 160 nm, and 80 nm, the capacity ratio can be further improved.

However, this does not necessarily mean that the best way to improve the device is to use a one-layer structure composed of the SiN film in the above embodiment. Though the maximum operating electric field per unit film thickness of the SiN film is considered to be as large as that of the $SiO_2$ film, the electrical characteristics of the SiN film are largely different from the $SiO_2$ film in the mechanism of leak current (breakdown voltage). In other words, while a desirable FN (Fouler-Nordheim) current flows in the $SiO_2$ film, a current of the Pool-Frenkel type flows in the SiN film. This means that if a current path is generated at any time in a part of the film, that part continues to be a current path thereafter. Consequently, while the SiN film is desirable, its superiority requires joint use of the $SiO_2$ film, through which only a small amount of leak current flows. The $SiO_2$ and the SiN films are stacked and used as a composite-membrane multilayer film. Though an NO structure is also effective, an ONO structure wherein the SiN film is sandwiched by the $SiO_2$ films is preferable. However, 10 nm in thickness is adequate for the $SiO_2$ films of the top layer or the bottom layer, and the $SiO_2$ film can be formed by an oxidation step or another known semiconductor manufacturing process. However, the structure of the present invention requires an insulating film of good quality to be provided on the semiconductor region which includes many defective layers such as a $P^+$ or an $N^+$ type impurity region, or a polycrystalline silicon film. Therefore, a CVD film of a deposition type which does not heavily depend on a base is preferable, and not an insulating film, such as a thermal oxidation film, which can only be purely formed over a base of pure silicon.

There is another point to be minded, that the $SiO_2$ film of 10 nm thickness should be located at least in the bottom layer in a direction of an electric field 35 applied to an electron e- in FIG. 3, since the $SiO_2$ film in the bottom layer can prevent electron flow from entering and destroying the SiN film. Therefore, in FIG. 3, the $SiO_2$ film 33 should be the bottom layer of $SiO_2$ and can be as thin as 10 nm. Generally, a thickness of 30 nm is adequate for the bottom layer, the $SiO_2$ film, to prevent leak current.

Figure 4:
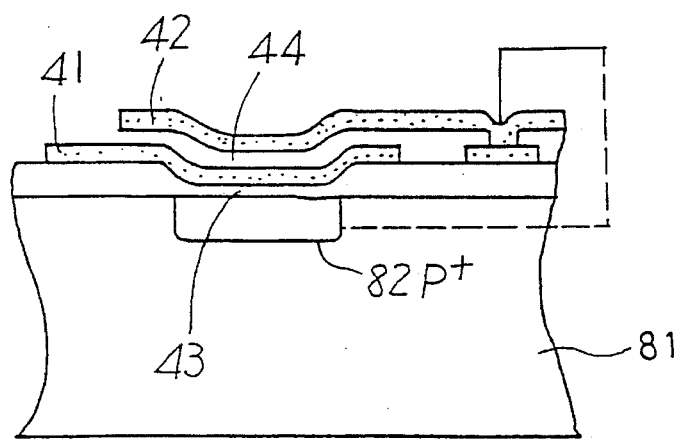
FIG. 4 is a simplified cross section showing the structure of a gate electrode disclosed in the third embodiment of the inventive semiconductor image sensor.
Figure 5:
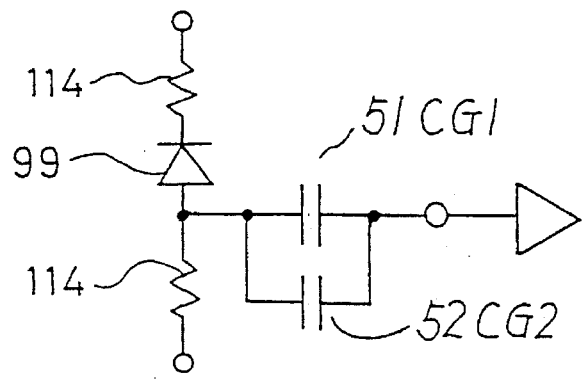
FIG. 5 is a simplified block diagram of a circuit showing the third embodiment of the inventive semiconductor image sensor.
Figure 6:
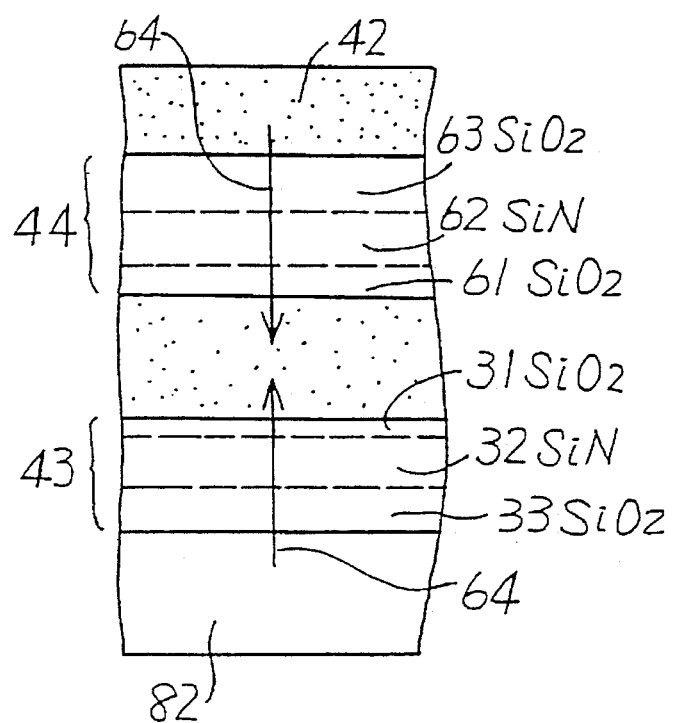
FIG. 6 is a simplified cross section showing the structure of a gate insulating film disclosed in the third embodiment of the inventive semiconductor image sensor.
Figure 7:
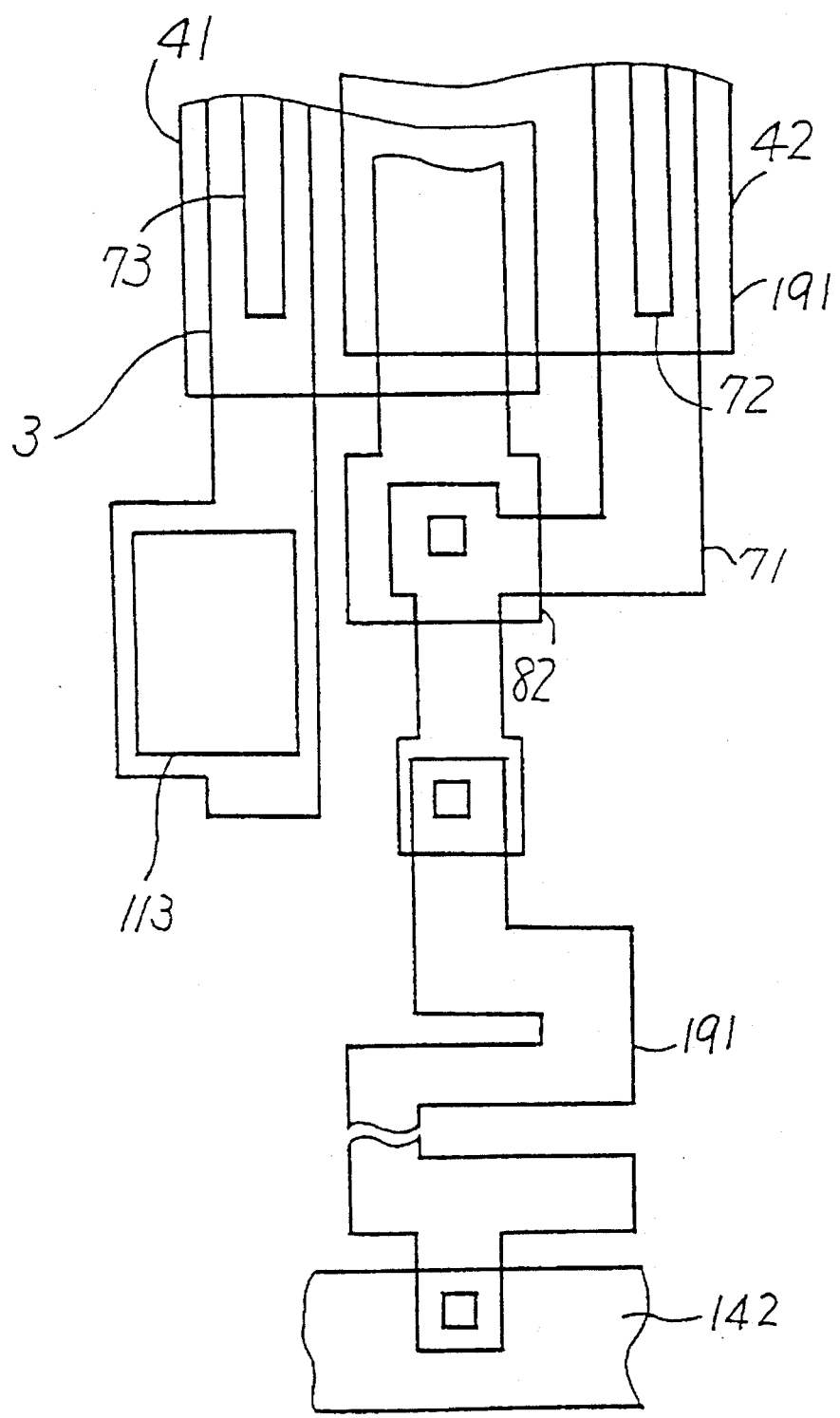
FIG. 7 is a simplified plan view showing the third embodiment of the inventive semiconductor image sensor.
Figure 8:
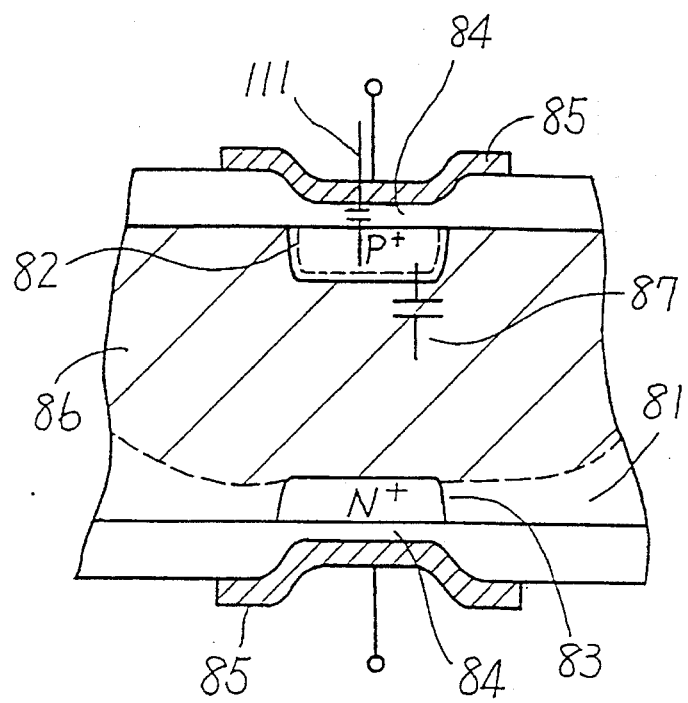
FIG. 8 is a simplified cross section showing a conventional semiconductor image sensor.
Figure 9:
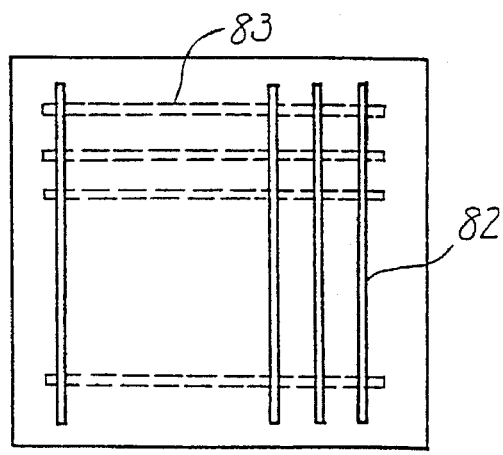
FIG. 9 is a simplified plan view showing the conventional semiconductor image sensor.
Figure 10:
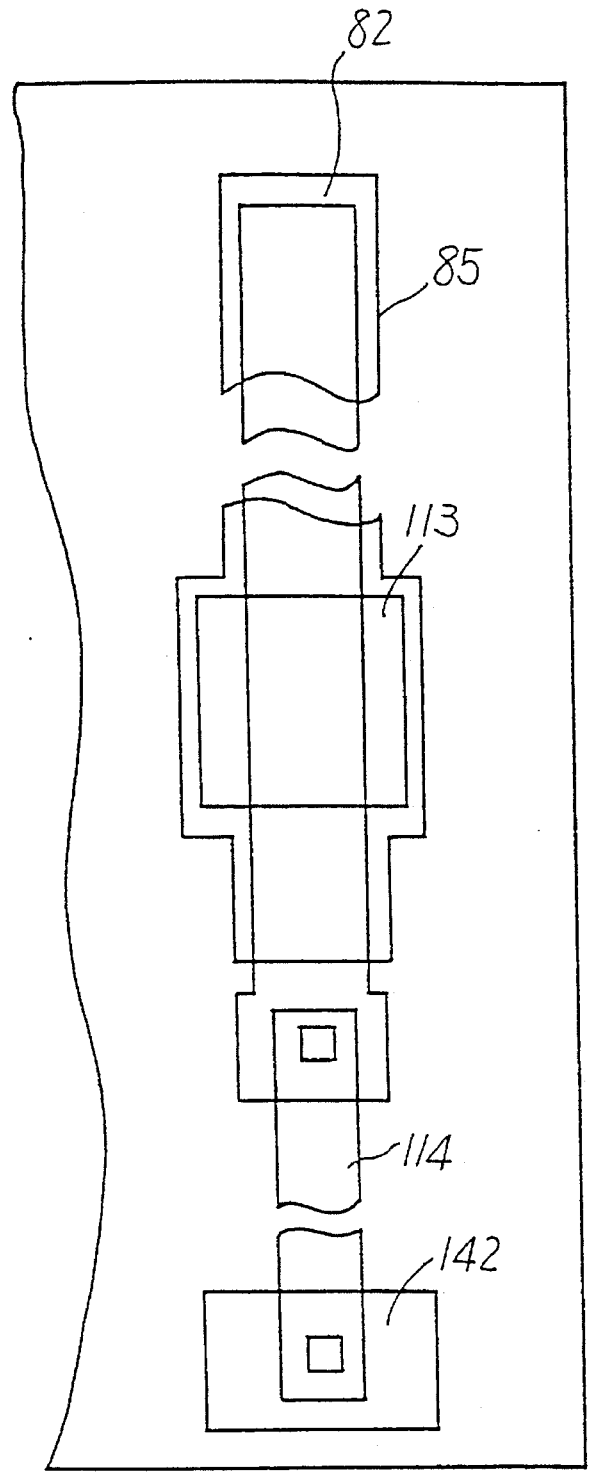
FIG. 10 is a simplified plan view showing a $P^+$ type strip portion of the conventional semiconductor image sensor.
Figure 11:
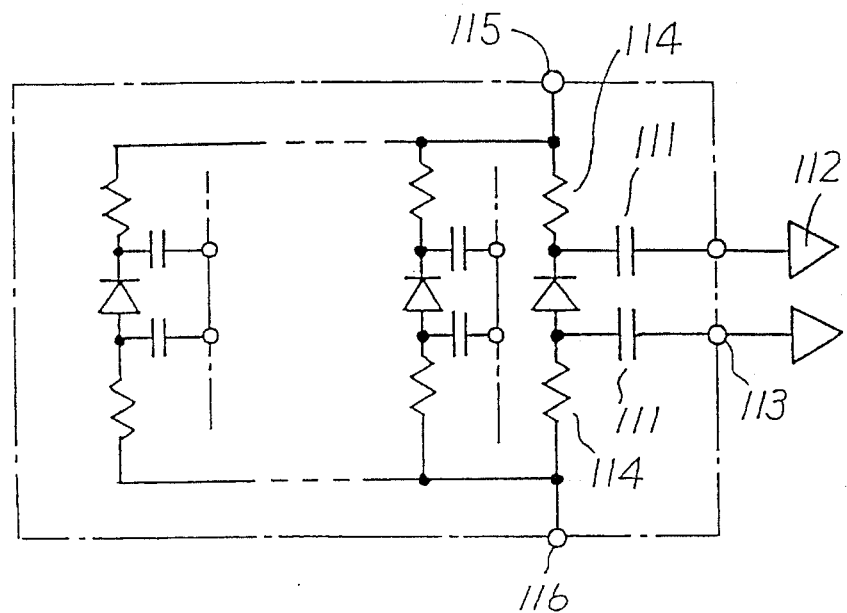
FIG. 11 is a schematic diagram showing a circuit of the conventional semiconductor image sensor.

FIG. 4 is a simplified cross section showing a structure of a gate electrode of a third embodiment of the inventive semiconductor image sensor. Two condensers are provided so as to be coupled in parallel to one terminal of a PN diode. Especially, in FIG. 4 the two condensers are of a deposition type and can be formed on a small area. In this embodiment, as shown in the drawing, a gate electrode has a double gate electrode structure composed of a first gate electrode 41 and a second gate electrode 42. In other words, the structure of a first condenser comprises $P^+$ type impurity region 82 and the first gate electrode 41 through a first gate insulating film 43, and the structure of a second condenser comprises the first gate electrode 41 and the second gate electrode 42 through a second gate insulating film 44. As shown in FIG. 7, the second gate electrode 42 has a contact hole 72 and is electrically coupled to a $P^+$ type impurity region 82 through an Al electrode 71. The first gate electrode 41 has a contact hole 73 and is coupled to an Al electrode 3 having an output terminal 113. With such a structure, a first condenser CG1 51 and a second condenser CG2 52 shown in FIG. 5 are composed of the first gate electrode 41 and the second gate electrode 42 respectively, and are electrically connected in parallel. If the image sensor is, as shown in FIG. 2, two-dimensional, a reading condenser is provided on both ends of the diode for an x-coordinate and a y-coordinate respectively. However, in the embodiment shown in FIG. 4, a plurality of the condensers are provided for either the x-coordinate or the y-coordinate. Therefore, twice the capacity of the conventional condenser CG can be obtained, and the capacity ratio on the readout circuit is remarkably increased. Further, a large-scale condenser can be formed with a small area by forming the first condenser and the second condenser of a layered structure. The same film as one which composes a voltage bias resistance RB 114, as shown in FIG. 7, can be deposited upon the POLY Si film to be the second gate electrode 42 or the electrode may be formed of a WSi film and others. The above does not lead to an increase in lead time on the manufacturing process, which is one of advantages of the present invention. Moreover, the capacity ratio can be further improved by forming the first gate insulating film 43 and the second gate insulating film 44 of, for example, the ONO structure, as explained with the second embodiment. In this case, as shown in FIG. 6, the direction of the electric field 64 applied to the electron e- in the second gate insulating film 44 is opposite to that in the first gate insulating film 43. Accordingly, a $SiO_2$ film 63 should be the top layer which may be as thin as 10 nm. Even if the condenser CG2 which includes the second gate insulating film 44 has the same area as that of the condenser CG1, the capacity ratio mentioned in the second embodiment can be improved remarkably to 8%. In this case, a CVD film is suitable for forming the thick $SiO_2$ film on the SiN film, since the SiN film is not subject to thermal oxidation. Further, a surface area of the $P^+$ type impurity region 82, that is, the condenser including the first gate insulating film is not necessarily important, either. That is, the condenser CG2 can be made to be larger than the condenser CG1. As the necessary condenser can be widely formed with the bulk of the area composed of the second gate insulating film, it is also possible that the area of the $P^+$ type impurity region 82 itself is decreased. If all the condensers are formed not on the impurity region 82 but only on the first gate electrode 41 in which a junction condenser is not generated, a capacity of junction condenser CJ 87 is also decreased, and therefore the capacity ratio can be most easily improved. In other words, the output condenser may actually be composed only of the second condenser, and not of both the second condenser and a first condenser, which is formed on the $P^+$ type impurity region 82. In such a case, it is also possible to short circuit the first gate electrode 41 and the $P^+$ type impurity region 82 and form the condenser between the first and second gate electrode 41 and 42. This structure is different from that shown in FIG. 4. Moreover, it is also possible that the $P^+$ type impurity region itself which is a dead region is concurrently decreased in area. Further, when the first gate electrode 41 is a silicide electrode, a condenser of high quality can be formed by forming a condenser-composing insulating film with a CVD film.

Figure 12:
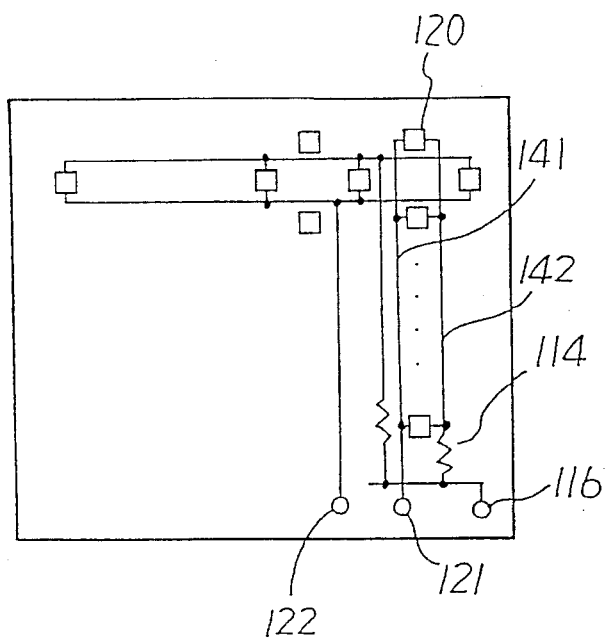
FIG. 12 is a simplified plan view showing the arrangement of photosensor elements disclosed in the fourth embodiment of the inventive semiconductor image sensor.
Figure 13:
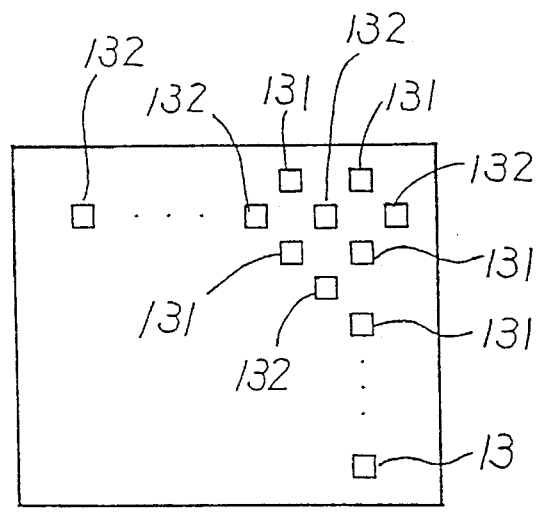
FIG. 13 is another simplified plan view showing the arrangement of photosensor elements disclosed in the fourth embodiment of the inventive semiconductor image sensor.

FIGS. 12 and 13 are simplified plan views showing the arrangement of photosensor elements disclosed in the fourth embodiment of the inventive semiconductor image sensor. As shown in the drawing, the small and short photosensors (hereinafter referred to as "pixels 120") are used instead of the strip-shaped photosensors, a plurality of the pixels are arranged in a row spaced from one another and each of the pixels are electrically coupled to one another. A plurality of rows of the pixels are arranged on the surface of the same semiconductor. Among pixels arranged alternately, the pixels which are read out as data on an x-coordinate are referred to herein as x-pixels, and the pixels which are read out as data on a y-coordinate are referred to herein as y-pixels. Both type of the pixels are arranged in a matrix as shown in the drawings.

Figure 14:
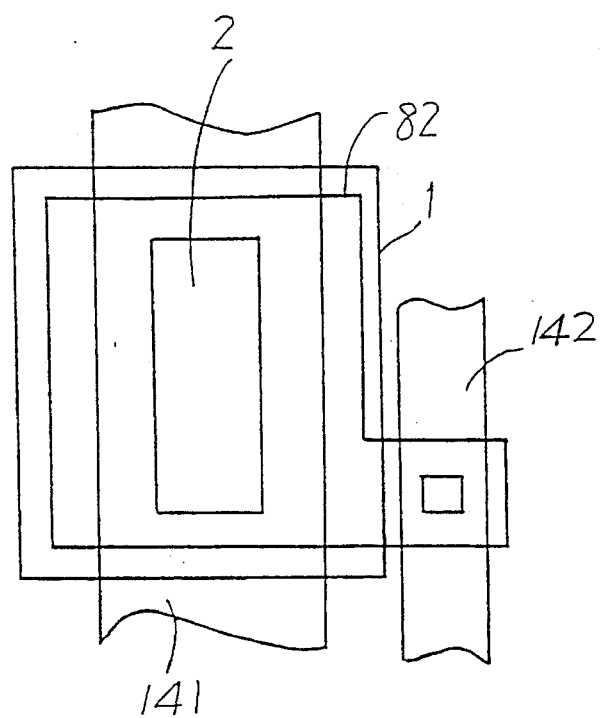
FIG. 14. is a simplified plan view of a unit element of a photosensor, that is, a pixel disclosed in the fourth embodiment of the inventive semiconductor image sensor.

FIG. 14 is a simplified plan view of the pixel disclosed in this embodiment of the inventive semiconductor image sensor. $P^+$ type impurity regions 82 for forming a PN type diode of the respective pixels are spaced away from one another. Basically the pixels can be regarded are obtained by decreasing in size the strips having a linear structure in the first or second or third embodiment of the present invention so that the pixels of the respective coordinates are arranged away from one another and each of the pixels are coupled electrically. Therefore each of the sensors can be provided independently. However, it is difficult to realize this embodiment with the conventional strip structure. In other words, the semiconductor image sensor disclosed in this embodiment requires metal wiring layers of at least two layers for coupling each of the pixels in an x and a y direction in addition to a gate electrode composed of at least one layer. Accordingly, it can be easily realized that a gate insulating film is composed of a plurality of layers by using a POLY Si film as the gate electrode to be the electrode of a condenser, and therefore the inventive image sensor of a pixel-type becomes possible.

Figure 15:
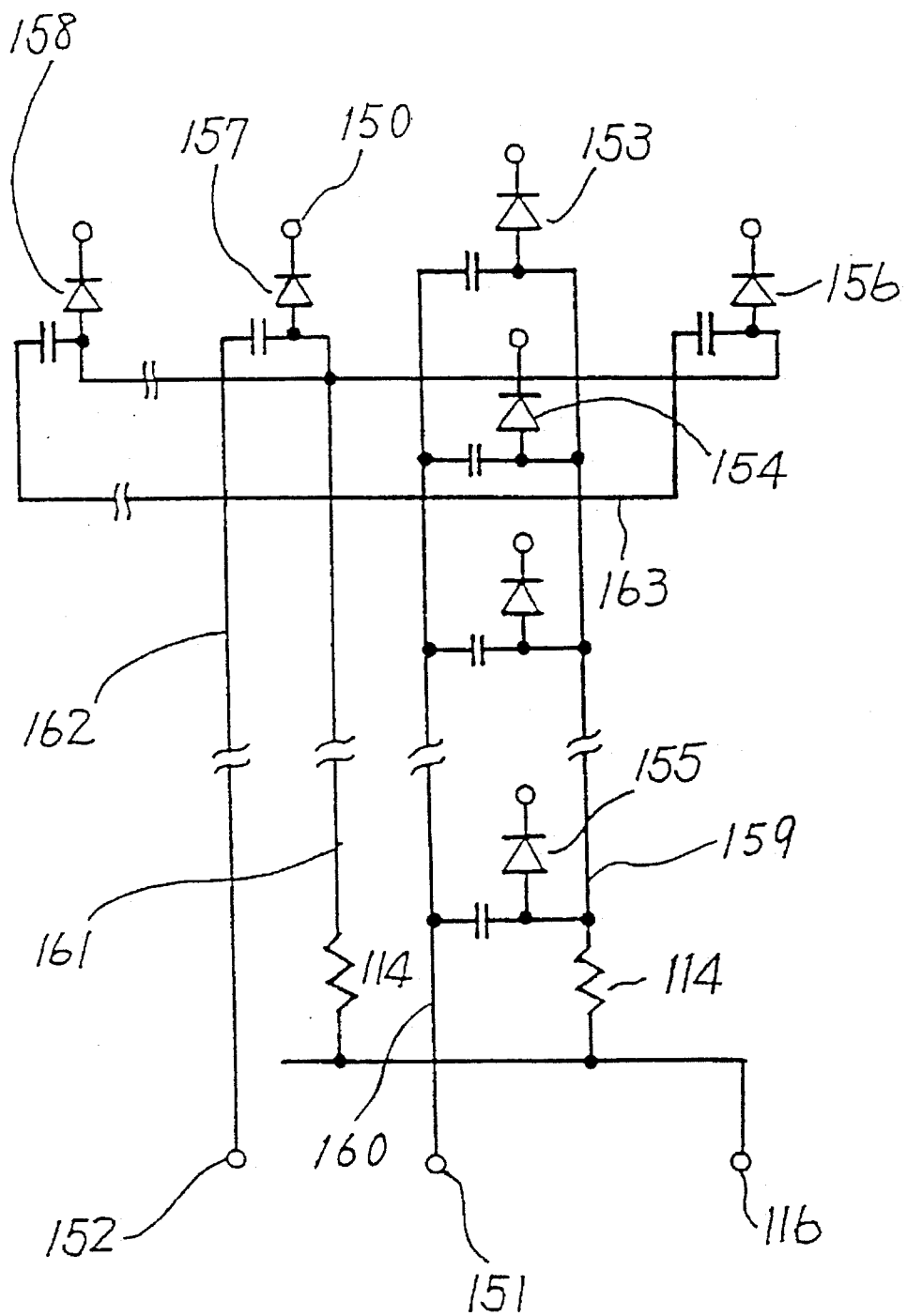
FIG. 15 is a simplified schematic diagram showing a circuit disclosed in the fourth embodiment of the inventive semiconductor image sensor.

FIG. 15 is a simplified block diagram showing a circuit disclosed in this embodiment of the inventive semiconductor image sensor. Respective pixels comprise a photodiode and a reading condenser. Respective outputs of a plurality of $X_1$ pixels arranged in the direction of a y-axis, that is, the $X_1$ pixel (1, 1) 153 to the $X_1$ pixel (1, n) 155 are connected to the $X_1$ output terminal 151 through an $X_1$ signal line 160, and bias lines which apply bias voltage to the photodiodes of the $X_1$ pixels respectively are coupled by an $X_1$ bias line 159 and connected to an anode 116 through a voltage bias resistance RB 114. A plurality of $Y_1$ pixels 156, 157, 158 arranged in the direction of an x-axis are wired in a similar way. Respective outputs are connected to the $Y_1$ output terminal 152. In such a manner, a number of the pixels are arranged two dimensionally and two dimensional data can be obtained. One electrode of the photodiode is an N type substrate 150 commonly. For instance, the $X_1$ bias line 159, the $X_1$ signal line 160, a $Y_1$ vertical bias line 161, and the vertical signal line 162 are arranged as the first-layer metal wiring, and a $Y_1$ horizontal bias line 164 and a $Y_1$ horizontal signal line 163 are arranged as the second-layer metal wiring, thereby all the terminals such as the X and Y outputs and the anode can be provided in one direction. A wiring which connects the respective pixels to one another is composed of a metal film such as an Al film so that the output of a detector can be detected quickly. The material of the condenser electrode can be different from that of wiring so that it is possible to select the respective films independently.

Figure 16:
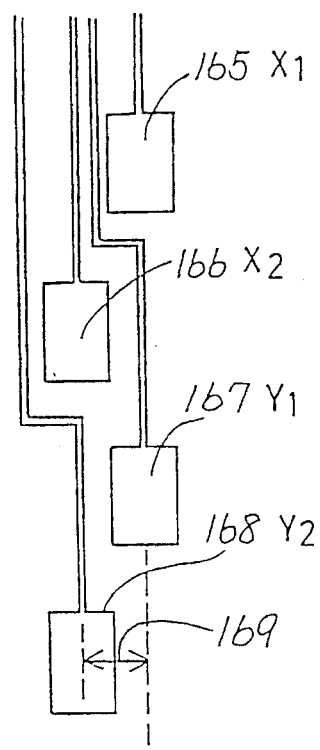
FIG. 16 is a simplified plan view showing the arrangement of pads for coupling an output terminal to an external apparatus disclosed in the fourth embodiment of the inventive semiconductor image sensor.

FIG. 16 is a simplified plan view showing the arrangement of pads 165–168 for coupling an output terminal with an external apparatus in this embodiment. Face-down-bonding is applied to couple the circuit to an external circuit, and a pad pitch 169 of about 50 μm under these circumstances is a value which is easily realized. At this time, the pitch between the two X pixels (similarly as to the Y pixels) is 50 μm, and an adequate resolution of the image sensor can be obtained, so that the resolution obtained by the inventive semiconductor image sensor is by no means inferior to that obtained by the conventional double-sided semiconductor image sensor using strip shaped photosensors.

With the structures described above, it is possible to realize the inventive semiconductor image sensor which is capable of obtaining two dimensional data with wiring arranged on only one side of the substrate, and to avoid the complexity of the manufacturing process resulting from the conventional two-sided device geometry. Consequently, the following three matters become possible:—to improve the yield of the image sensor, to abrade one side of the semiconductor image sensor at the last step of the manufacturing process, and to determine the thickness of the semiconductor substrate necessary for detection freely. Furthermore, there has recently been an enlargement in the diameters of semiconductor substrates, and a wafer of a larger diameter used as the semiconductor image sensor and manufactured by a newer manufacturing process—namely, a manufacturing process of higher integration (scaled down device geometries) may be produced with a higher yield. While the conventional two-sided semiconductor image sensor is subject to destruction because of the thinness of the wafer, and can not enjoy the benefits of the latest manufacturing process, the benefits thereof can be enjoyed with the inventive structure.

To prevent any misapprehensions, the following explanation will be given. It is well known that there have existed semiconductor image sensors capable of obtaining two dimensional data with wiring arranged on only one side of the semiconductor. These devices include CCD sensors of the so-called frame-transfer type and random-access type semiconductor image sensors, referring to an aspect of the output signal therefrom. These image sensors, however, belong to a class of devices known as storage type sensors. Contrastingly, the present invention specifically concerns an apparatus for detecting two dimensional data having the capability of detecting signals in each of the pixels on a real-time basis. The inventive apparatus has effects which are largely different from those of a random-access type sensor which is formed by arranging elements of a storage-type sensor two-dimensionally. In other words, while the storage-type sensor is a sensor which simply detects intensity of incident light periodically, the inventive image sensor detects the change in intensity of incident light on a continuous real-time basis.

Figure 17:
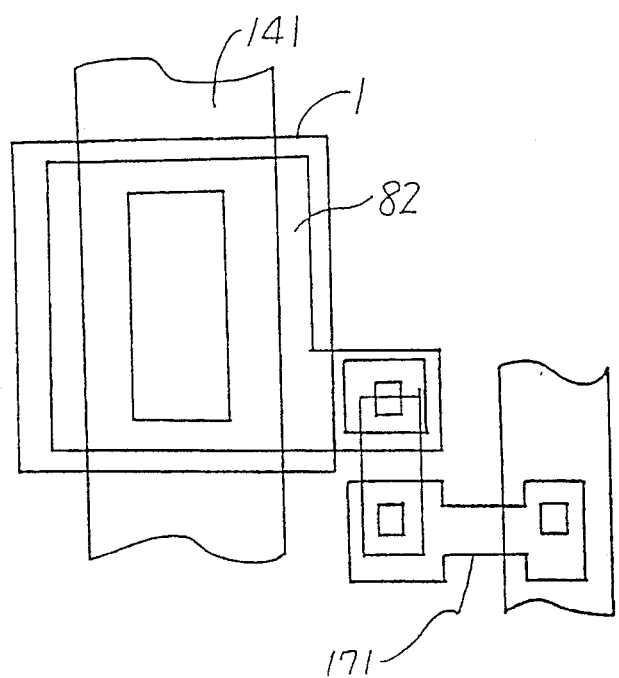
FIG. 17 is a simplified plan view of a pixel disclosed in the fifth embodiment of the inventive semiconductor image sensor.

FIG. 17 is a simplified plan view of a pixel disclosed in the fifth embodiment of the inventive semiconductor image sensor. Each pixel comprises a photodiode, a reading, or output condenser and a voltage bias resistance. Each pixel is provided with a POLY Si film 171 composing a voltage bias resistance RB 114. When a very high resistivity is required, it is possible to manufacture the POLY Si by a manufacturing process different from that preferably used for manufacturing a POLY Si composing the gate electrode 1, and it is occasionally preferable.

Figure 18:
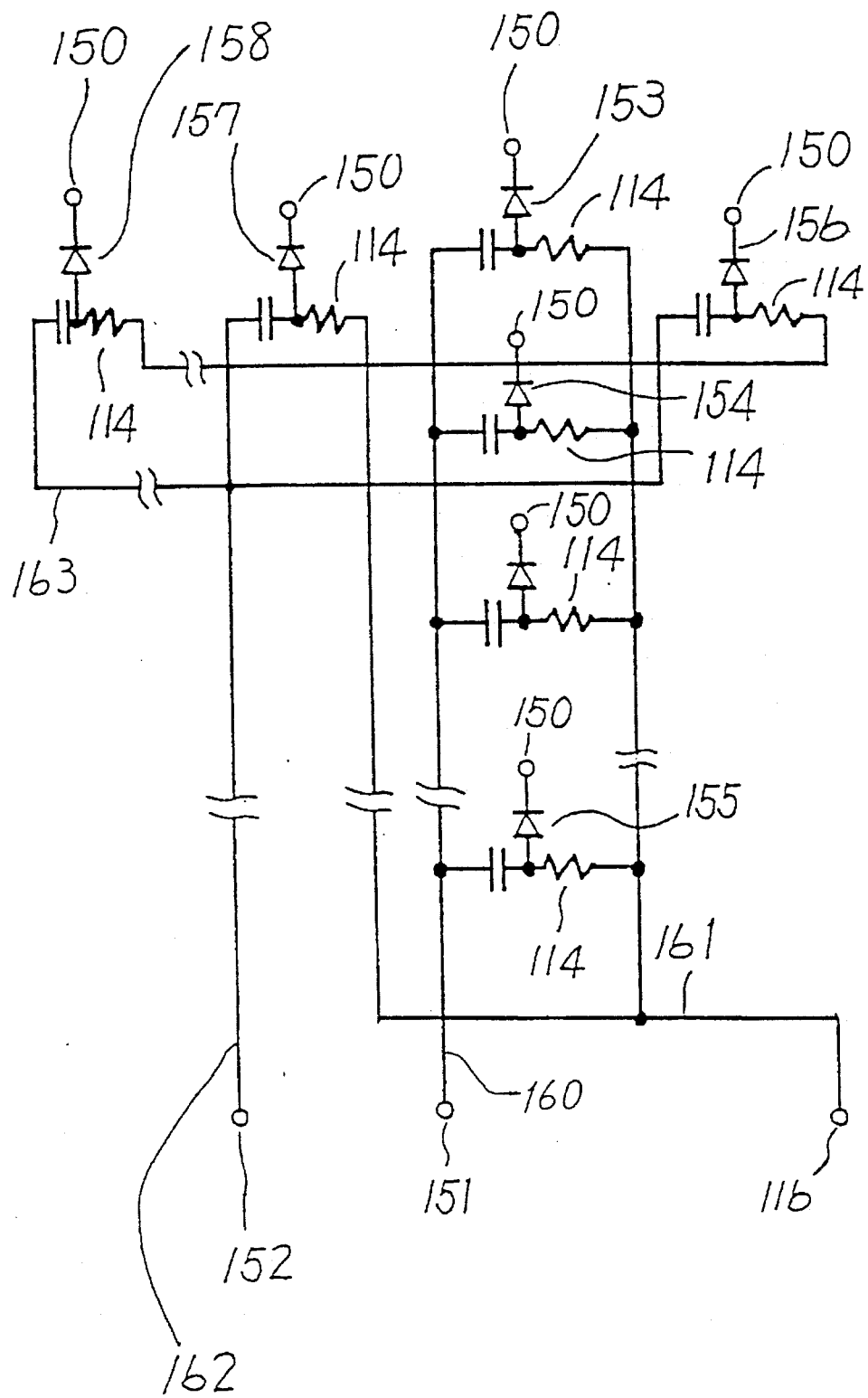
FIG. 18 is a simplified block diagram showing a circuit disclosed in the fifth embodiment of the inventive semiconductor image sensor.

FIG. 18 is a simplified schematic diagram showing a circuit disclosed in this embodiment of the inventive semiconductor image sensor. Each electrode of the reading condenser is electrically connected to the output terminal through the wiring 160. Further, a bias resistance 114 is connected to a terminal between a photodiode and a reading condenser. Further, each bias resistance is connected to the anode electrode 116 through the bias line 161. As judged from the circuit, such a wiring brings about an effect that a dead region can be minimized to a localized spot defect, for instance, even if there is a defective pixel due to insulating failure of the condenser, only that pixel is defective and other pixels are not affected by the defective pixel because respective pixels and each element of the pixels are spaced from one another, operable independently and are electrically connected to one another.

Figure 19:
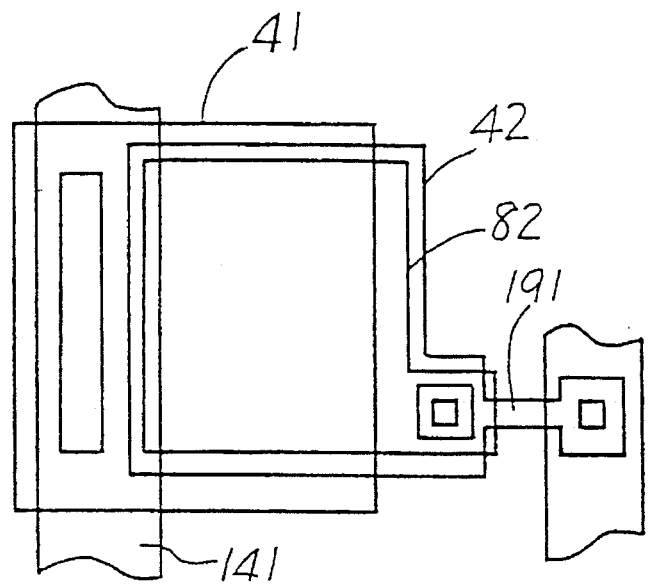
FIG. 19 is a simplified plan view showing a pixel disclosed in the sixth embodiment of the inventive semiconductor image sensor.

FIG. 19 is a simplified plan view of a pixel disclosed in the sixth embodiment of the inventive image sensor. In this embodiment, a ratio of readout capacity is improved by using pixels each of which has a double gate electrode structure as disclosed in the third embodiment of the present invention. Moreover, each of the pixels are added with a POLY Si 191 as a resistance RB 114.

Figure 20:
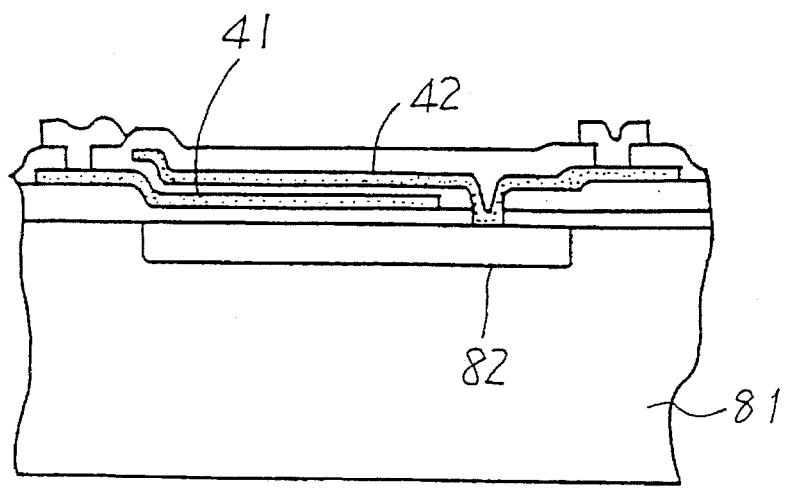
FIG. 20 is a simplified cross section showing a gate electrode disclosed in the sixth embodiment of the inventive semiconductor image sensor.

FIG. 20 is a simplified cross section showing a structure of a gate electrode disclosed in this embodiment. A second gate electrode 42 can be formed by the same manufacturing process as that for a POLY Si 191, but a different process from the above process can be used when it is necessary to obtain high resistance with the POLY Si 191. In this case, the second gate electrode 42 has a structure of three layers of POLY Si. It is also possible to decrease the resistance of the second gate electrode 42 even if the second gate electrode remains of a two-layer structure.

Figure 21:
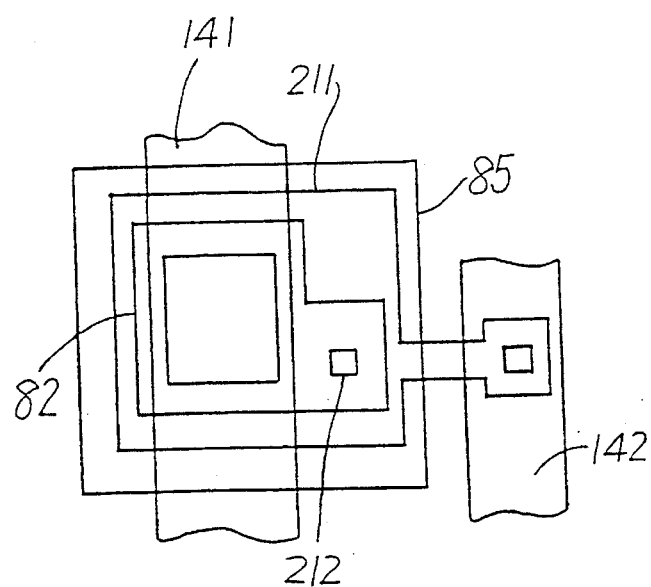
FIG. 21 is a simplified plan view showing a pixel disclosed in the seventh embodiment of the inventive semiconductor image sensor.

FIG. 21 is a simplified plan view of a pixel disclosed in the seventh embodiment of the present inventive semiconductor image sensor.

Figure 22:
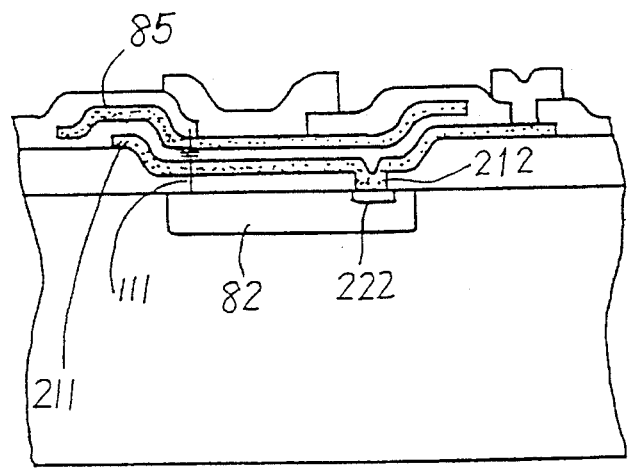
FIG. 22 is a simplified cross section showing the structure of the seventh embodiment of the inventive semiconductor image sensor.

FIG. 22 is a simplified cross section showing a structure of this embodiment. A POLY Si of a first layer is coupled to an N type emitter region 222, which is an impurity region of an opposite conductivity type, through an emitter aperture 212. It is possible to form as fine an emitter region as possible and to thereby limit the capacitance between a base and an emitter to the smallest value possible by forming the emitter region of a so-called POLY Si emitter structure. A larger base-emitter capacitance causes a harmful effect in that the response rate of the image sensor is decreased. A condenser CG 111 is formed between the POLY Si emitter electrode 211 and a POLY Si gate electrode 85 of a second layer. It is obvious, as explained in the third embodiment, to decrease the area of a P$^+$ type impurity region 82 as small as possible.

Figure 23:
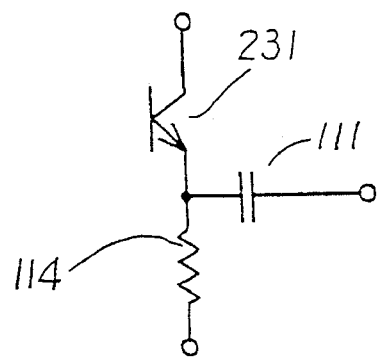
FIG. 23 is a simplified circuit schematic diagram showing a pixel disclosed in the seventh embodiment of the inventive semiconductor image sensor.

FIG. 23 is a simplified circuit diagram showing the pixel disclosed in this embodiment. As shown in this figure, a bipolar NPN type transistor 231 serving as a light sensing element is formed in the circuit, so that a higher gain can be obtained when compared with that of a PN type junction diode. Further, a high gain can be obtained by using an avalanche photodiode (APD) type sensor which is a PN type diode having an N type impurity region under the P$^+$ type impurity region to cause an avalanche breakdown. Such an effect can be obtained even if an NPN type and APD type structure of this embodiment is applied to all the strip-type photosensors disclosed the previous embodiment.

Figure 24:
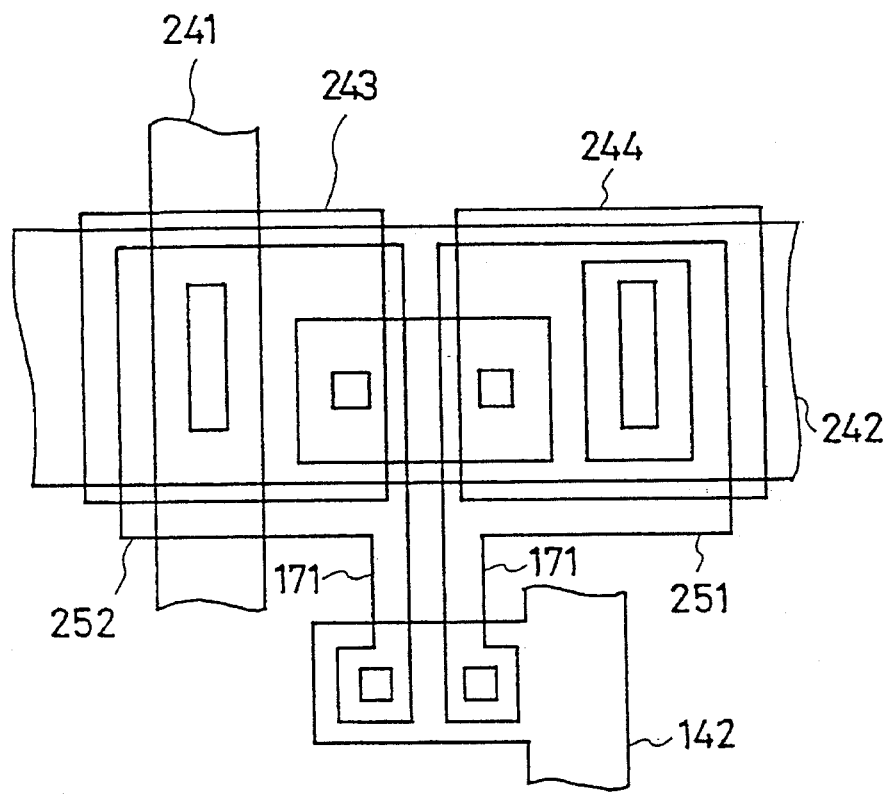
FIG. 24 is a simplified plan view showing a pixel disclosed in the eighth embodiment of the inventive semiconductor image sensor.
Figure 25:
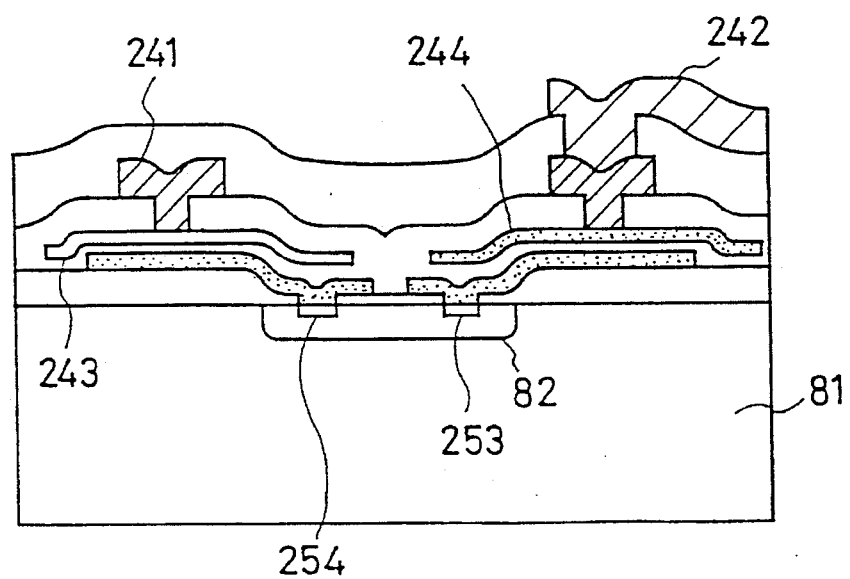
FIG. 25 is a simplified cross section showing a structure of a gate electrode disclosed in the eighth embodiment of the inventive semiconductor image sensor.
Figure 26:
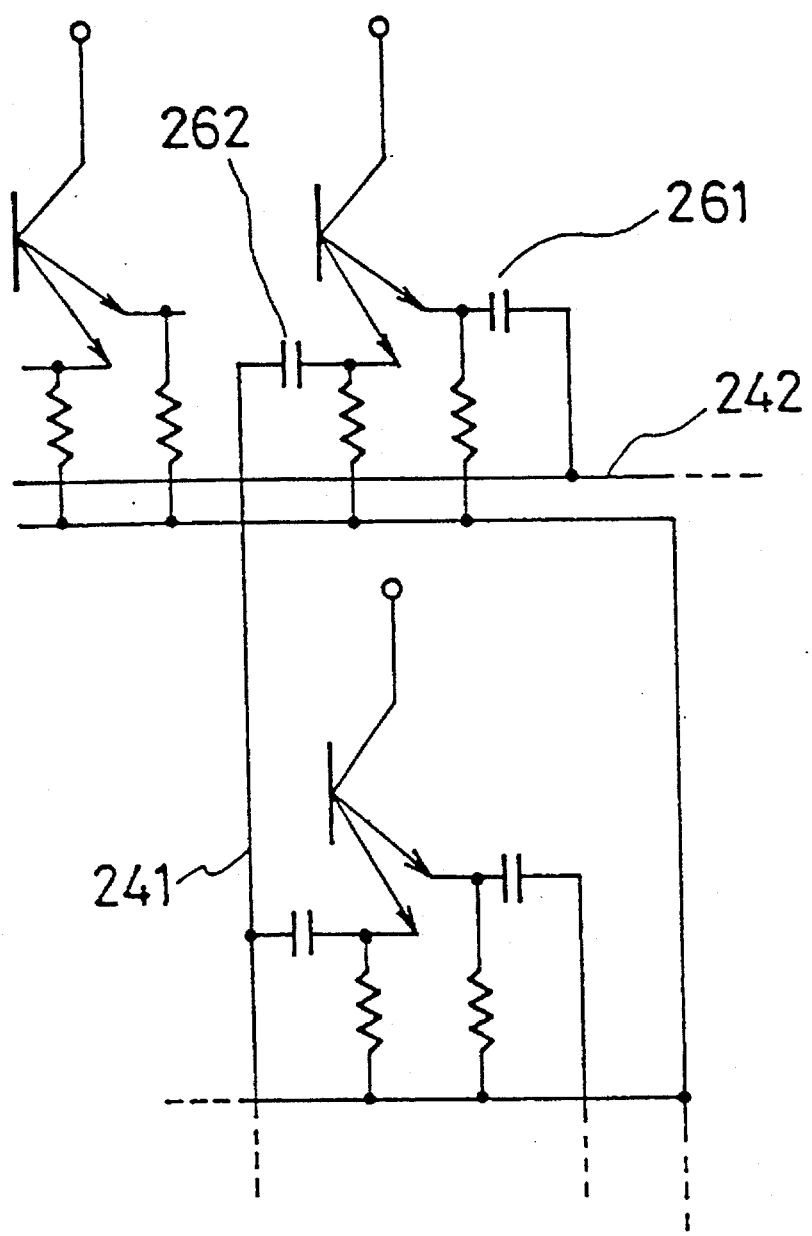
FIG. 26 is a simplified schematic diagram showing a circuit disclosed in the eighth embodiment of the inventive semiconductor image sensor.
Figure 27:
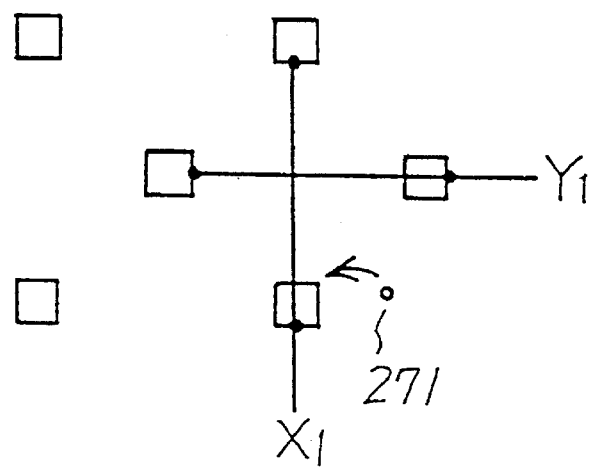
FIG. 27 is a simplified plan view showing the arrangement of the pixels disclosed in the fourth embodiment of the inventive semiconductor image sensor.
Figure 28:
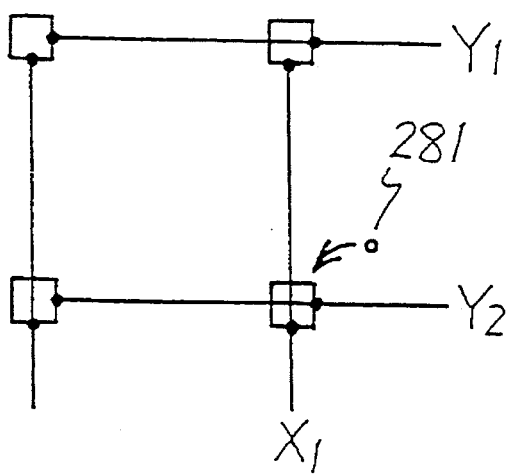
FIG. 28 is a simplified plan view showing the arrangement of the pixels disclosed in the eighth embodiment of the inventive semiconductor image sensor.

FIG. 24 is a simplified plan view of a pixel disclosed in an eighth embodiment. In addition to the seventh embodiment, two gate electrodes which are an X gate electrode 243 and a Y gate electrode 244 respectively, are provided on the POLY Si emitter electrodes 251 and 252. Further, an X signal line 241 and a Y signal 242 which are connected to the X gate electrode 243 and the Y gate electrode 244 respectively, are wired. FIG. 25 is a simplified cross section showing a structure of the gate electrode in this embodiment. An X POLY Si emitter region 254 and a Y POLY Si emitter region 253 are in the P type impurity region 82. FIG. 26 is a simplified block diagram showing a circuit disclosed in this embodiment of the inventive semiconductor image sensor. As judged from the drawing, the structure mentioned above enables one pixel to output both an X and a Y signal as, for example, a pixel includes output condensers CGX and CGY, 262 and 261 for an X and Y signal. This pixel is called to a twin-pixel. FIG. 28 is a simplified plan view showing an arrangement of the pixel disclosed in this embodiment. FIG. 27 is a simplified plan view of the arrangement of the pixel disclosed in the fourth embodiment.

For instance, a charged particle 271 generates only one charge. If the pixel is arranged as shown in FIG. 27, the charge is detected only by one of an X pixel or a Y pixel but not the other pixel. However, in the embodiment shown in FIG. 28, the one charge 281 is detected as both the X and the Y signal, as one charge respectively. Though there is no difference in physical size between the two embodiments, an arithmetic process of the signal at a later stage is much easier in this embodiment. Moreover, in this embodiment, even if the resolution of the image sensor is the same as that in the fourth embodiment, half the number of pixels than used in the fourth embodiment are sufficient to produce an image sensor of the same resolution, and the yield can be improved.

Figure 29A:
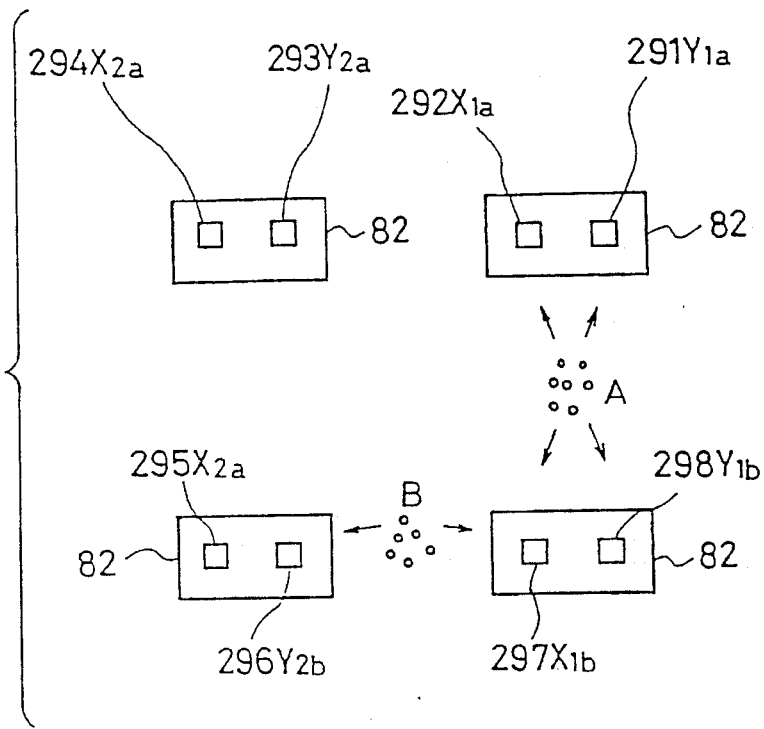
FIG. 29(a) is a simplified plan view showing the pixels disclosed in the ninth embodiment of the inventive semiconductor image sensor.
Figure 29B:
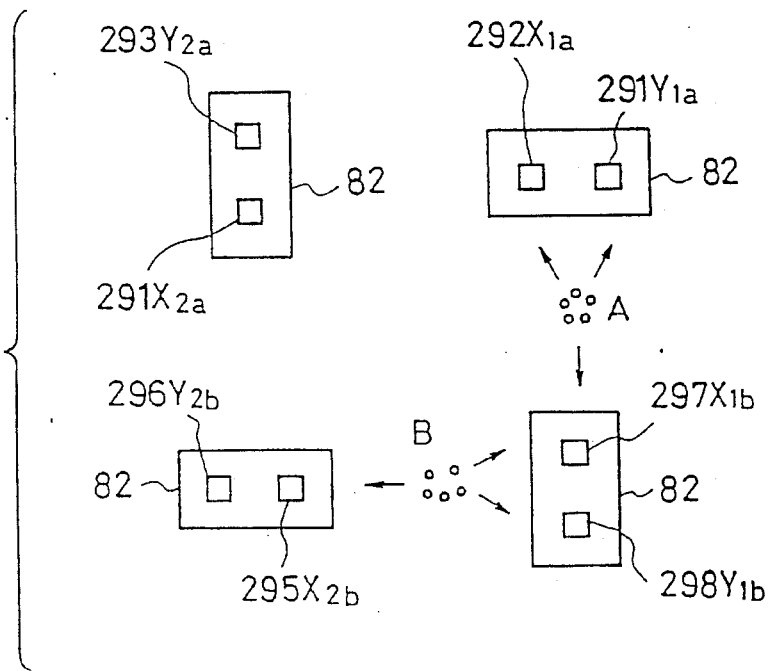
FIG. 29(b) is a simplified plan view showing an alternative arrangement of the pixels disclosed in the eighth embodiment of the inventive semiconductor image sensor.

FIG. 29(b) is a simplified diagram showing two-dimensional arrangement of twin pixels in accordance with the ninth embodiment of the inventive semiconductor image sensor. This figure illustrates a P$^+$ type impurity region 82 and an emitter region for simplification. If the pixels are arranged, for instance, as shown in FIG. 29(a), generated charges A are derived to four transistors, i.e., two transistors in the two pixels respectively, as signals as shown in the figure and generated charges B are derived only to two transistors, i.e., one transistor in the two pixels respectively, which causes the intensity of absolute values of the signals to be unbalanced. However, the signals can be derived with the balanced absolute values by arranging the pixels in an x-direction and a y-direction to be alternately placed in various directions, respectively. In other words, the signals can be stably output if the pixels arranged in the x-direction or the y-direction have an alternating pattern.

Figure 30:
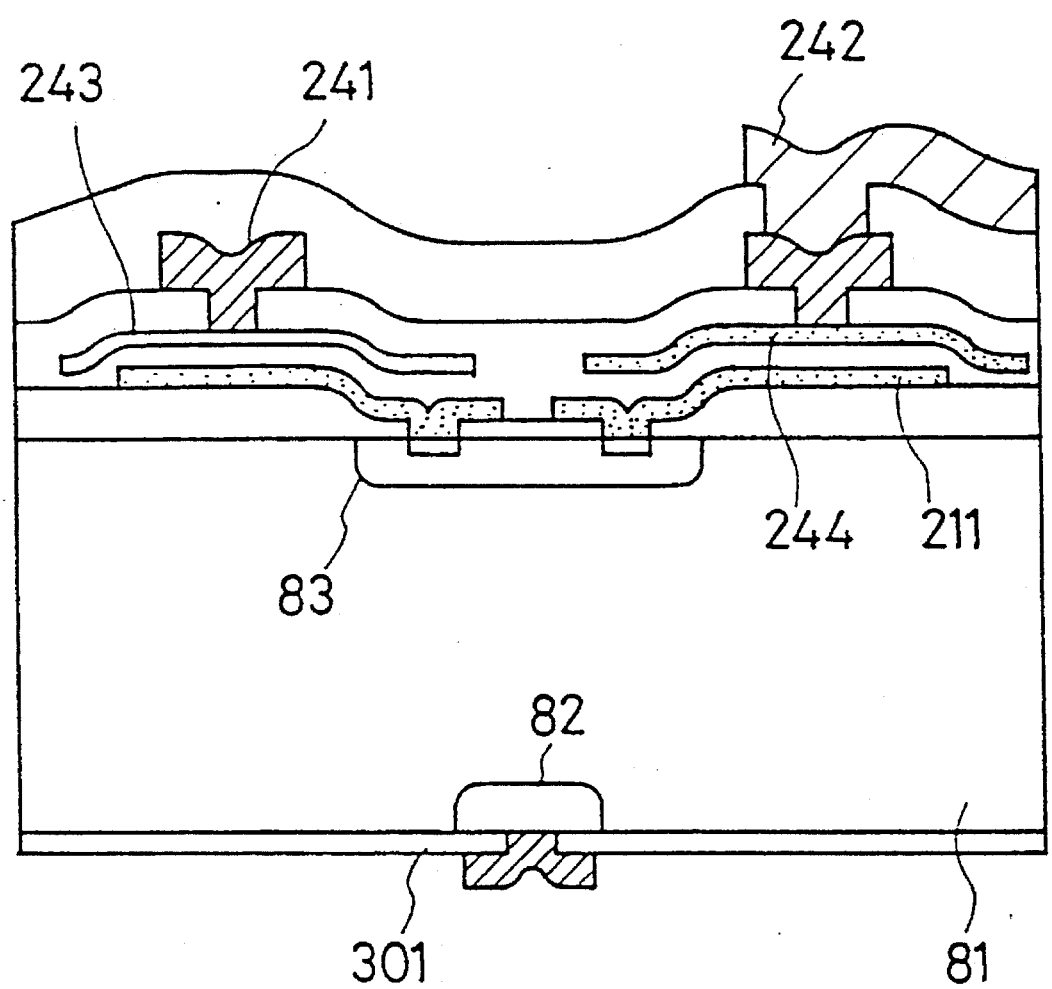
FIG. 30 is a simplified cross section showing the structure of the tenth embodiment of the inventive semiconductor image sensor.
Figure 31:
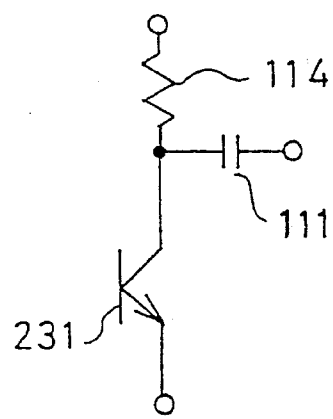
FIG. 31 is a simplified circuit diagram showing the pixels having an NPN junction disclosed in the tenth embodiment of the inventive semiconductor image sensor.
Figure 32:
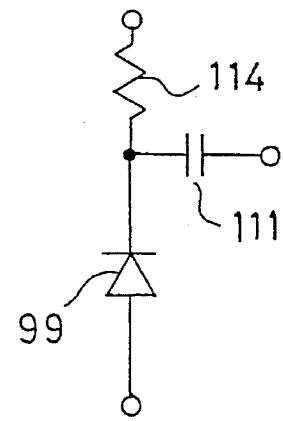
FIG. 32 is a simplified circuit diagram showing the pixels having a PN type junction disclosed in the tenth embodiment of the inventive semiconductor image sensor.

FIG. 30 is a simplified cross section of the tenth embodiment of the inventive semiconductor image sensor of a diode type. As shown in the figure, it is possible to form the first to ninth embodiments explained above on an N$^-$ type impurity region 81. In this case, generally a P$^+$ type impurity region 82 is formed in a large area of a single surface opposite to the side on which the above embodiments are formed. However, as shown in FIG. 30, the P$^+$ type impurity region can also be formed in a part of the surface. In this case, a total surface area of a PN type junction 301 is by far smaller than that of a P$^+$ impurity region having a sensor structure of a conductivity type opposite to that of the embodiment shown in FIG. 30. It is also possible to form the P$^+$ type impurity regions to be minimally from a few cubic μm to some dozen cubic μm in size and arranged with equal spaces all over the surface. The spaces are determined in accordance with the desired resolution of detection and are below the width of a narrowest portion of a depletion layer. Therefore, a yield of the pixels and reliability of the image sensor can be considerably improved. There is no utility in forming a PNP type junction by further providing a P$^+$ type impurity region on an N$^+$ type impurity region 83, for a high level of $h_{FE}$ can not be obtained in any event. However, it is also as effective as in the seventh embodiment to form an NPN type junction by providing the N$^+$ type impurity region on a part of the P$^+$ type impurity region on the opposite side mentioned above again. FIG. 31 is a simplified circuit diagram showing the pixel of the NPN type junction disclosed in this embodiment. FIG. 32 is a simplified circuit diagram showing the pixel of the PN type junction disclosed in this embodiment.

Figure 33:
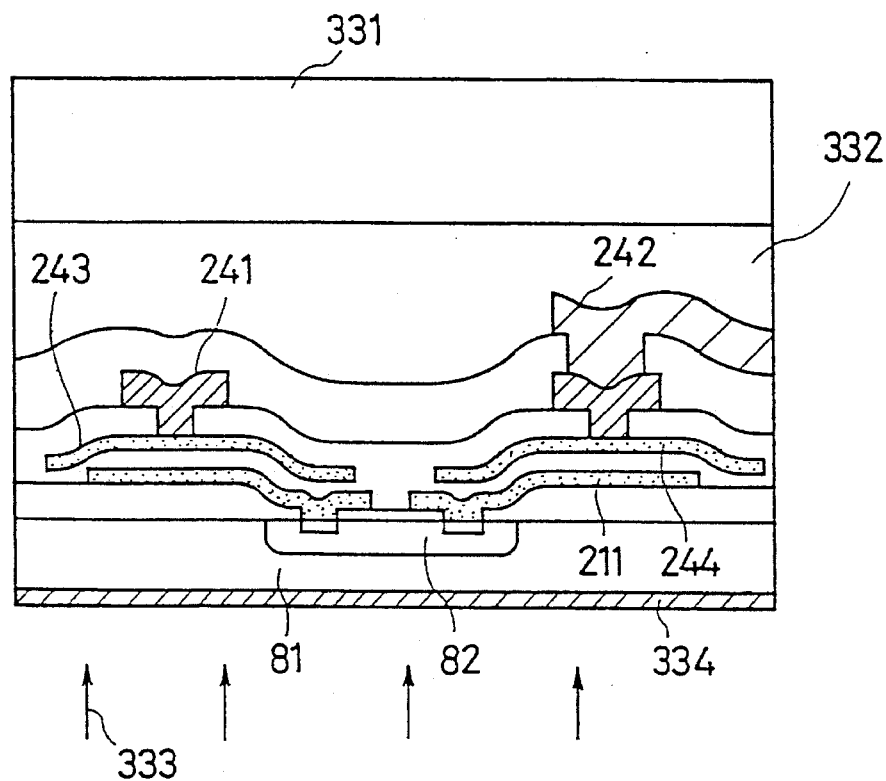
FIG. 33 is a simplified cross section showing the structure of the eleventh embodiment of the inventive semiconductor image sensor.

FIG. 33 is a simplified cross section of an eleventh embodiment of the inventive semiconductor image sensor. As explained above, at the last step in each semiconductor manufacturing process of the fourth to the ninth embodiments of the present invention, as shown in the figure, a bonding layer 332 is formed, then an additional reinforcing plate 331 is formed thereon, and afterwards the N type semiconductor substrate 81 is cut; thereby it is possible to decrease the thickness of the substrate, for example to 200 μm, or, if desired, to 100 μm or thinner. If the above is realized, for instance, X-rays having rather low energy can be detected by irradiating a side of the substrate 81, opposite to the side on which condensers are formed, with the X-rays; this is considerably innovative. The electrode 334 can also be formed on the surface of an N⁻ type substrate.

Figure 34:
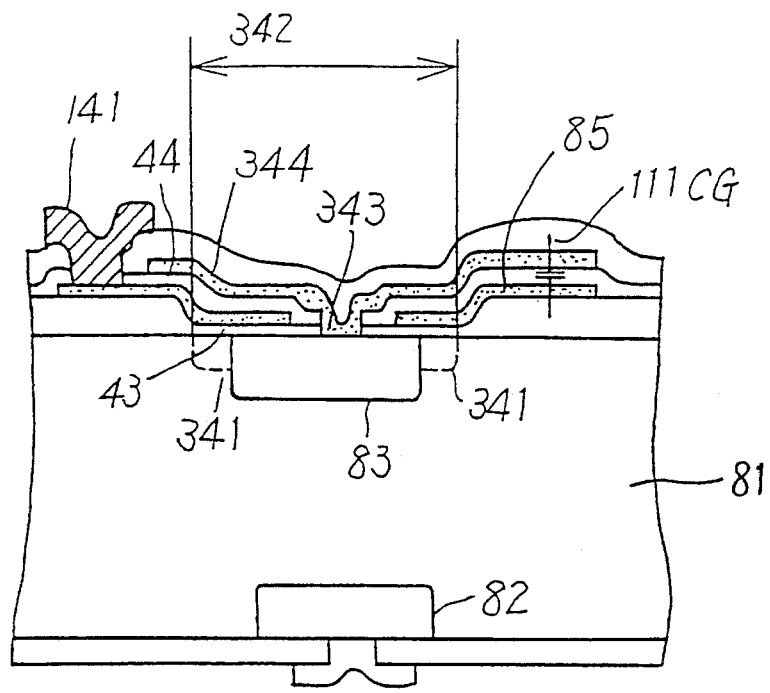
FIG. 34 is a simplified cross section showing the structure of the twelfth embodiment of the inventive semiconductor image sensor.

FIG. 34 is a simplified cross section showing a twelfth embodiment of the inventive semiconductor image sensor. As explained in the discussion of the tenth embodiment, it is also possible to apply this invention on an N⁺ type impurity region 83. However, when the N⁺ type impurity region 83 is formed in an N type semiconductor substrate 81, a partial inversion region 341 as shown in the figure is preferably formed in order to electrically separate potentials of the respective N⁺ type impurity regions of two adjacent strips or two adjacent pixels. The partial inverting region 341 can be obtained by, for instance, by applying voltage in the circuit shown in FIG. 36 with a bias power source 361 and thereby inverting a surface of the N type semiconductor substrate 81. The bias power source 361 is connected to an output terminal between a reading condenser and a sense amplifier in this circuit.

The existence of the inverting region ensures separation of the potentials of adjacent strips or pixels even in view of an increase in interface state caused by contamination or radiation damage. Therefore, this embodiment uses a structure in which the second gate electrode 344 is provided so as to be connected to the N⁺ type impurity region 83 through an aperture 343. However, a first gate electrode 85 is formed so as to surround a circumference of the N⁺ type impurity region 83. In a section 342, an insulating film as thick as a first insulating gate is formed in a properly large area not limited to a part over the N⁺ type impurity region 83. With such a structure, the inversion region 341 can be formed all around the N⁺ type impurity region 83 within the section 342.

Figure 37A:
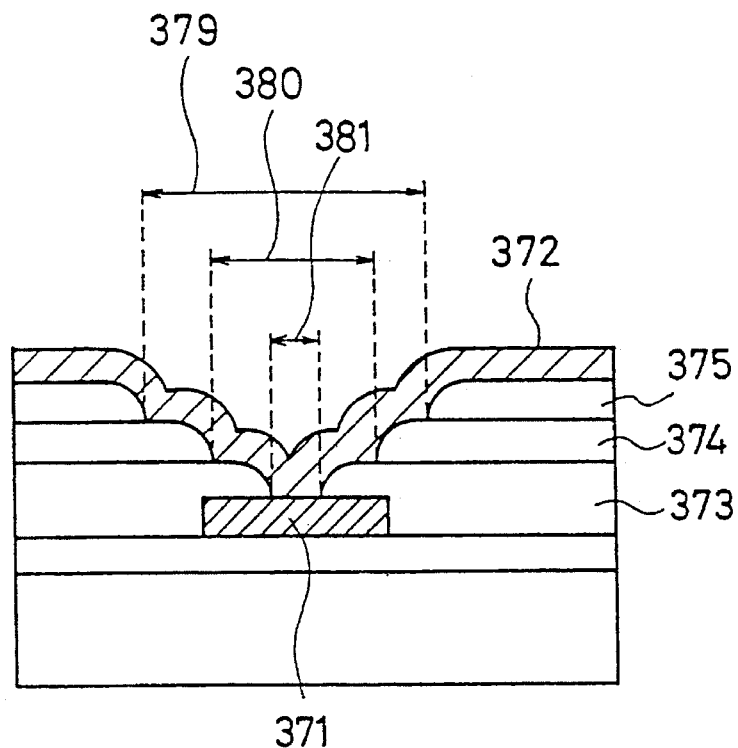
FIGS. 37(a) and (b) are a simplified plan view showing an example wherein the twelfth embodiment is applied to the pixels which has an X gate electrode additionally.

FIGS. 37(a) and (b) are simplified diagrams showing the thirteenth embodiment of the present invention. In the present invention, explanations have been repeatedly given as to advantages of aluminum two-layer structure. This embodiment is related to a method for coupling a first-layer Al wiring 371 and a second-layer Al wiring 372. As shown in the figure, an insulating film has a multilayer structure composed of three layers 373, 374 and 375. The three layers have apertures 379, 380, and 381 respectively, and the sizes of the apertures become larger in the sequence, because this structure enables the insulating film to be thick and can prevent the second-layer Al wiring 372 from being disconnected over steps on the insulating film. It is necessary to lower a capacity of a portion in which the first-layer Al wiring 371 and the second-layer Al wiring 372 cross as much as possible. The insulating film is preferably made up of polyimide resin, composed of three layers, and 4 to 8 μm in total thickness.

Figure 35:
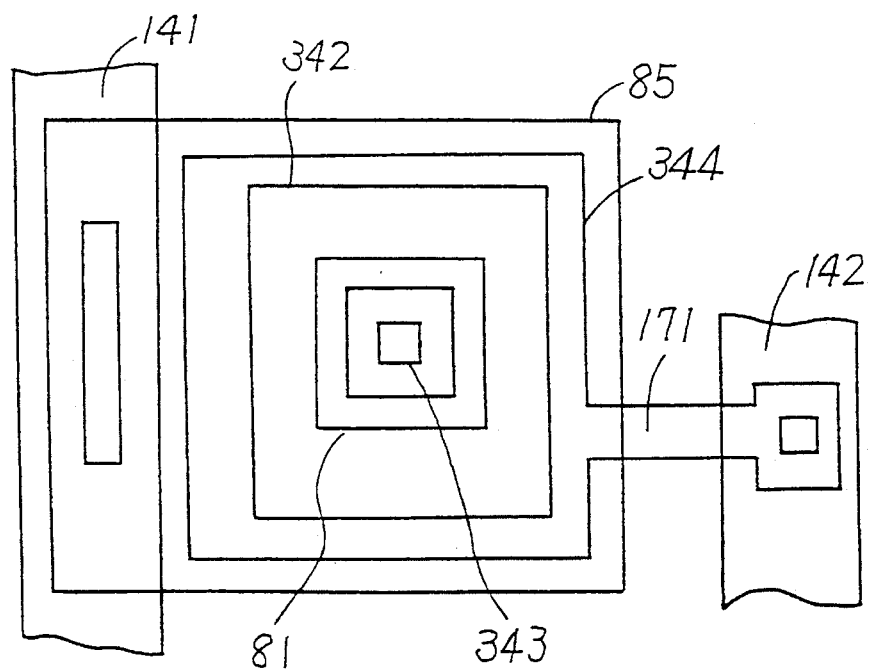
FIG. 35 is a simplified plan view showing the twelfth embodiment of the inventive semiconductor image sensor.
Figure 37B:
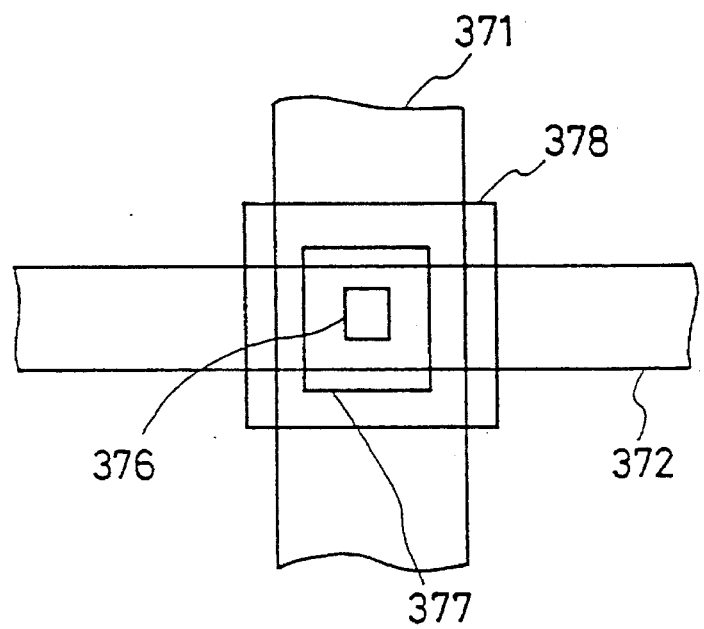

FIG. 35 a simplified plan view showing this embodiment. FIG. 37(b) is a simplified plan view showing an example that this embodiment is applied to the pixels which also has an X gate electrode 243.

As explained above, the present invention achieves the following effects. A high yield of a gate insulating film can be obtained by using, as a gate electrode 85, not aluminum but a POLY Si film (a polycrystalline silicon film), or silicide or a metal silicide with a high melting point such as WSi (tungsten silicide) (strictly its composition is indefinite as expressed as $W_xSi_y$) or TiSi (titanium silicide) (expressed as $Ti_xSi_y$ in the same manner). Read-out performance can be remarkably improved by forming a gate insulating film having not a one-layer structure composed a $SiO_2$ film but being of a multi-layer structure including CVD film, as shown in FIG. 3. Such a film is composed of, for example, a $SiO_2$ film 31 (a top layer), a SiN film 32 (a silicon nitride film, $Si_xN_y$) (a middle layer), and a $SiO_2$ film 33 (a bottom layer) and forming a plurality of a reading condensers having a two-gate electrode structure composed of a first gate electrode 41 and a second gate electrode 42. Two dimensional data can be obtained on a real-time basis with wiring arranged only on a signal side of an image sensor not by using strip-shaped photosensors but rows of small individual photosensors (pixels) and arranging such pixels on a single surface of a semiconductor. A high yield of the pixels can be obtained by providing a bias resistance RB 114 for each of the pixels 120. Further, high gain can be obtained by providing a bipolar transistor or an avalanche photodiode but not a PN type junction to the photosensor. In this way, the inventive semiconductor photoelectric detector with high functions and high performances is realized.

Figure 38:
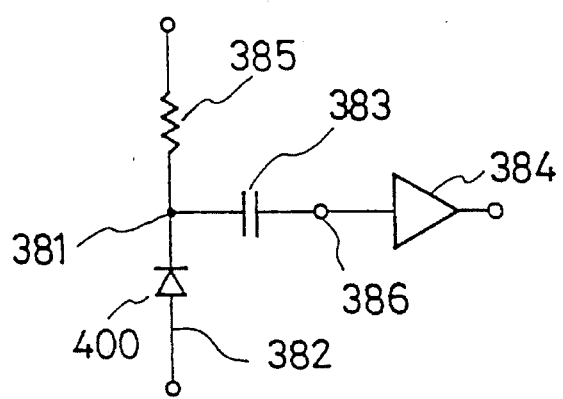
FIG. 38 is a simplified schematic diagram showing a circuit of the inventive photoelectric detector.
Figure 39:
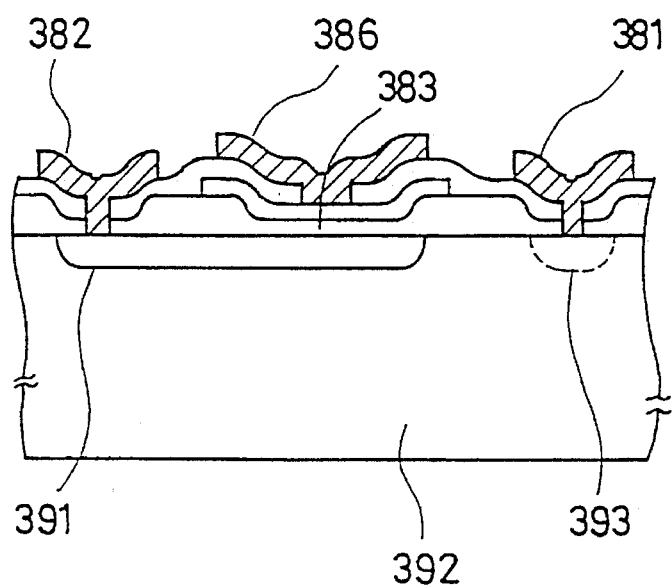
FIG. 39 is a simplified cross section of the semiconductor photoelectric detector shown in FIG. 38.
Figure 40:
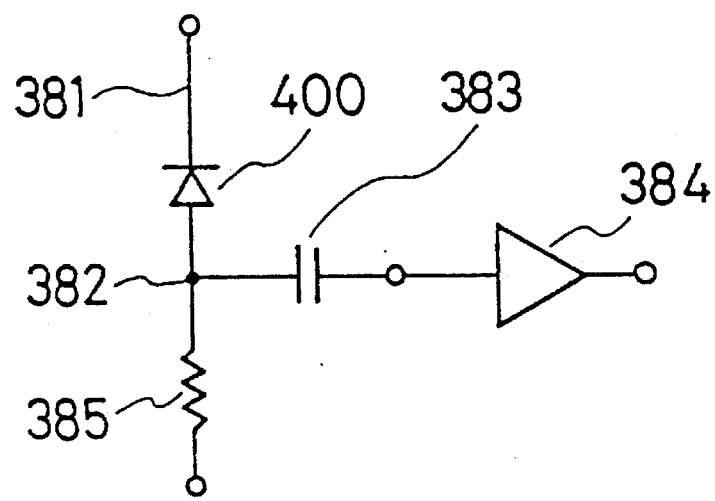
FIG. 40 is a simplified schematic diagram showing a circuit of the inventive photoelectric detector.

Explanation has been given as to the embodiments of the semiconductor image sensor in which detectors are arranged two-dimensionally. FIGS. 38, 39 and 40 show the embodiments of a semiconductor photoelectric detector in which a detector is not two dimensionally but solely arranged. As explained above, the present invention is effective in a sensor having a large area. Therefore, generally the present invention is embodied in a two-dimensional image sensor having a large area. However, the present invention is also effective in the semiconductor photoelectric detector with a single detector therein for improvement of quality and performance. It is also possible to apply the present invention to an image sensor which includes a diode having a large area, for example, 1 cm square, as the detector as well as to the two-dimensional image sensor. FIG. 38 is an electric circuit diagram of a photoelectric detector having a single sensor 400. A bias resistance 385 is connected to a cathode electrode 381 of a diode 400. A high voltage is applied to the diode 400 through an anode electrode 382 and the bias resistance 385. A condenser for reading out an output from the sensor (hereinafter referred to as "a reading condenser") CG 383 is connected to the cathode electrode 381. An amplifier 384 processes a differentiating signal of potential of the cathode electrode 381 which is supplied to a reading electrode 386 of the reading condenser 383, and thereby light is detected as an electric signal. FIG. 39 is a cross section of the semiconductor photoelectric detector shown in FIG. 38. A PN type diode which functions as a light receiving region is composed of an N type substrate 392 and P⁺ type impurity region 391 provided on the substrate 392. On the P⁺ type impurity region 391 are provided the condenser 383 including the P⁺ type impurity region 391 and the reading electrode 386 as the electrodes. The cathode electrode 381 is provided on a surface of the substrate 392 through an N⁺ type impurity region 393. Further, the bias resistance 385 is connected to the cathode electrode 381. FIG. 40 is an electric equivalent circuit diagram of a photoelectric detector in which a bias resistance 385 is connected to an anode electrode 382 and a reading condenser 383 is provided between an amplifier 384 and a connecting point of the anode electrode 382 and the bias resistance 385. Since, in general, output is detected either in an x direction or in a y direction in case of the photoelectric detector with a single sensor, it is adequate that the reading condenser is connected to either the anode electrode 382 or a cathode electrode 381.

The same effect as that obtained in the two-dimensional image sensor can be obtained by applying a polycrystalline silicon film to the reading condenser and using a CVD film or a composite membrane of a $SiO_2$ and a SiN film as the insulating film of the condenser. The capacity of the light receiving region can be reduced by providing an electrode for the condenser in addition to the $P^+$ type impurity region. Further, the present invention is not limited to the detector with the single sensor and the detector in which a plurality of the sensors are arranged in matrix. The present invention is also effective if it is applied to a detector in which the sensors are arranged one-dimensionally or if it is to be applied to a detector having a plurality of the sensors provided at random.

An image sensor is primarily used in the preferred embodiments to explain the present invention. Of course, the present invention relates to not only a image sensor but also a radial ray detector and further an electromagnetic wave detector.

What is claimed is:

1. A semiconductor radiation detector comprising: a semiconductor substrate; radiation detecting means formed on the semiconductor substrate for detecting incident radiation and producing a corresponding electrical output signal; an output electrode connected to the radiation detecting means; and a capacitor electrically connected to the radiation detecting means and the output electrode; wherein the radiation detecting means comprises a PN junction formed in a first surface of the semiconductor substrate and the output electrode is formed of a material selected from the group consisting of poly-si and a metal silicide; and wherein the capacitor comprises a plurality of electrodes and a plurality of insulating layers.

2. A semiconductor radiation detector according to claim 1; wherein the plurality of electrodes and insulating layers are arranged in stacked pairs to form a plurality of capacitors, wherein each of the pairs is electrically coupled in parallel.

3. A semiconductor radiation detector comprising: a semiconductor substrate; radiation detecting means formed on the semiconductor substrate for detecting incident radiation and producing a corresponding electrical output signal; an output electrode connected to the radiation detecting means; and a capacitor electrically connected to the radiation detecting means and the output electrode; wherein the radiation detecting means comprises a PN junction formed in a first surface of the semiconductor substrate and the output electrode is formed of a material selected from the group consisting of poly-si and a metal silicide; and wherein the capacitor comprises an electrode of the radiation detecting element, the output electrode, and a dielectric film formed of silicon dioxide and silicon nitride disposed therebetween.

4. A semiconductor radiation detector according to claim 3; wherein the dielectric film comprises a first layer formed of silicon dioxide formed on a surface of the semiconductor substrate, a second layer formed of silicon nitride formed on the first layer, and a third layer formed of silicon dioxide formed on the second layer.

5. A semiconductor radiation detector according to claim 4; wherein the first layer is thicker than the third layer.

6. A semiconductor radiation detector comprising: a first input terminal for supplying a first voltage; a first voltage bias resistor electrically connected to the first input terminal; a second input terminal for supplying a second voltage; a second voltage bias resistor electrically connected to the second input terminal; a power source for supplying a voltage bias to the first and second terminals; a radiation sensor for sensing incident radiation coupled to the first input terminal through the first voltage bias resistor and coupled to the second input terminal through the second voltage bias resistor; a first capacitor connected to one end of the radiation sensor for reading a first signal from the radiation sensor; and a second capacitor connected to the other end of the radiation sensor for reading a second signal from the radiation sensor; wherein the radiation sensor comprises a PN junction formed in a semiconductor substrate, the PN junction comprising a first impurity region formed in a first surface of a the semiconductor substrate and having a conductivity type opposite that of the substrate, a first gate insulating film disposed on the first impurity region, and a first gate electrode disposed on the first gate insulating film; and wherein the first capacitor comprises the first impurity region as a bottom electrode, the first gate insulating film as a dielectric and the first gate electrode as a top electrode, and the gate insulating film has a three-layer structure consisting of silicon dioxide as a top layer, silicon nitride as a middle layer and silicon dioxide as a bottom layer, and the gate electrode is formed of a material selected from the group consisting of poly-silicon and metal silicide.

7. A semiconductor radiation detector according to claim 6; further comprising an interlayer insulation film disposed on the first gate electrode and a metal film disposed on the interlayer insulation film, and wherein the first gate electrode is electrically connected to the metal film through a contact hole formed in the interlayer insulation film disposed between the first gate electrode and the metal film.

8. A semiconductor radiation detector according to claim 6; wherein a thickness of the silicon dioxide top layer is 0–10 nm, and a thickness of the silicon dioxide bottom layer is 10–120 nm.

9. A semiconductor radiation detector according to claim 6; wherein the second capacitor is formed on a second surface of the semiconductor substrate opposite the first surface, and comprises a second impurity region as a bottom electrode, a second insulating film as a dielectric and a second gate electrode as a top electrode, wherein the second impurity region is formed in the second surface of the semiconductor substrate and has a higher impurity concentration than that of the semiconductor substrate, the second insulating film is formed on the second impurity region, and the second gate electrode is formed on the second insulating film.

10. A semiconductor radiation detector according to claim 9; further comprising an interlayer insulation film disposed on the second gate electrode and a metal film disposed on the interlayer insulation film, and wherein the second gate electrode is electrically connected to the metal film through a contact hole formed in the interlayer insulation film disposed between the second gate electrode and the metal film.

11. A semiconductor radiation detector according to claim 9; wherein a thickness of the silicon dioxide top layer is 0–10 nm, and a thickness of the silicon dioxide as the bottom layer is 10–120 nm.

* * * * *